(12) United States Patent
Husted et al.

(10) Patent No.: US 8,498,589 B2
(45) Date of Patent: Jul. 30, 2013

(54) POLAR MODULATOR WITH PATH DELAY COMPENSATION

(75) Inventors: Paul J. Husted, San Jose, CA (US); William W. Si, San Jose, CA (US); David J. Weber, Mountain View, CA (US); Xiaoru Zhang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1108 days.

(21) Appl. No.: 12/172,375

(22) Filed: Jul. 14, 2008

(65) Prior Publication Data

US 2009/0311979 A1 Dec. 17, 2009

Related U.S. Application Data

(60) Provisional application No. 61/061,103, filed on Jun. 12, 2008.

(51) Int. Cl.
*H04B 1/66* (2006.01)

(52) U.S. Cl.
USPC ........ 455/102; 455/108; 455/112; 455/114.3; 455/115.1; 455/126; 455/127.1

(58) Field of Classification Search
USPC . 455/102, 108–113, 126–127.5, 114.1–115.1
See application file for complete search history.

(56) References Cited

U.S. PATENT DOCUMENTS

| | | | |
|---|---|---|---|
| 6,873,836 B1 | 3/2005 | Sorrells et al. | |
| 7,333,780 B2* | 2/2008 | Udagawa et al. | 455/126 |
| 7,359,680 B2* | 4/2008 | Klemmer | 455/102 |
| 7,372,917 B2* | 5/2008 | Jensen | 375/296 |
| 7,715,808 B2* | 5/2010 | Shimizu et al. | 455/108 |
| 7,869,541 B2* | 1/2011 | Frantzeskakis et al. | 375/296 |
| 8,050,637 B2* | 11/2011 | Shimizu et al. | 455/114.3 |
| 2004/0183601 A1 | 9/2004 | Zhang | |
| 2005/0245208 A1* | 11/2005 | Udagawa et al. | 455/102 |
| 2006/0057976 A1* | 3/2006 | Klemmer | 455/102 |
| 2006/0116091 A1 | 6/2006 | Hammes et al. | |
| 2006/0246856 A1* | 11/2006 | Udagawa et al. | 455/108 |
| 2007/0142005 A1* | 6/2007 | Sundstrom | 455/126 |
| 2008/0002788 A1 | 1/2008 | Akhtar et al. | |
| 2008/0026706 A1* | 1/2008 | Shimizu et al. | 455/108 |
| 2009/0203327 A1* | 8/2009 | Rofougaran | 455/73 |
| 2009/0311972 A1 | 12/2009 | Husted et al. | |

OTHER PUBLICATIONS

U.S. Appl. No. 12/016,955, filed Jan. 18, 2008, Husted, Paul J., et al.
U.S. Appl. No. 12/172,374, filed Jul. 14, 2008, Husted, Paul J., et al.
"U.S. Appl. No. 12/172,374 Office Action", Feb. 24, 2011, 13 pages.
"U.S. Appl. No. 12/172,374 Final Office Action", Sep. 23, 2011, 15 pages.

* cited by examiner

*Primary Examiner* — Edward Urban
*Assistant Examiner* — Rui Hu
(74) *Attorney, Agent, or Firm* — DeLizio Gilliam, PLLC

(57) ABSTRACT

A modulation system comprising a signal processing unit and a modulator. The signal processing unit may generate a low frequency modulator signal, a high frequency modulator signal, and a modulator amplitude control signal. The modulator may generate a modulated signal for transmission via a wireless network based, at least in part, on the low frequency modulator signal, the high frequency modulator signal, and the modulator amplitude control signal. The signal processing unit comprises a delay compensation unit for delaying the generation of the high frequency modulator signal and the modulator amplitude control signal based, at least in part, on signal generation and modulation path delays associated with the low frequency modulator signal to substantially align the modulator signals at the output of the modulation system.

20 Claims, 14 Drawing Sheets

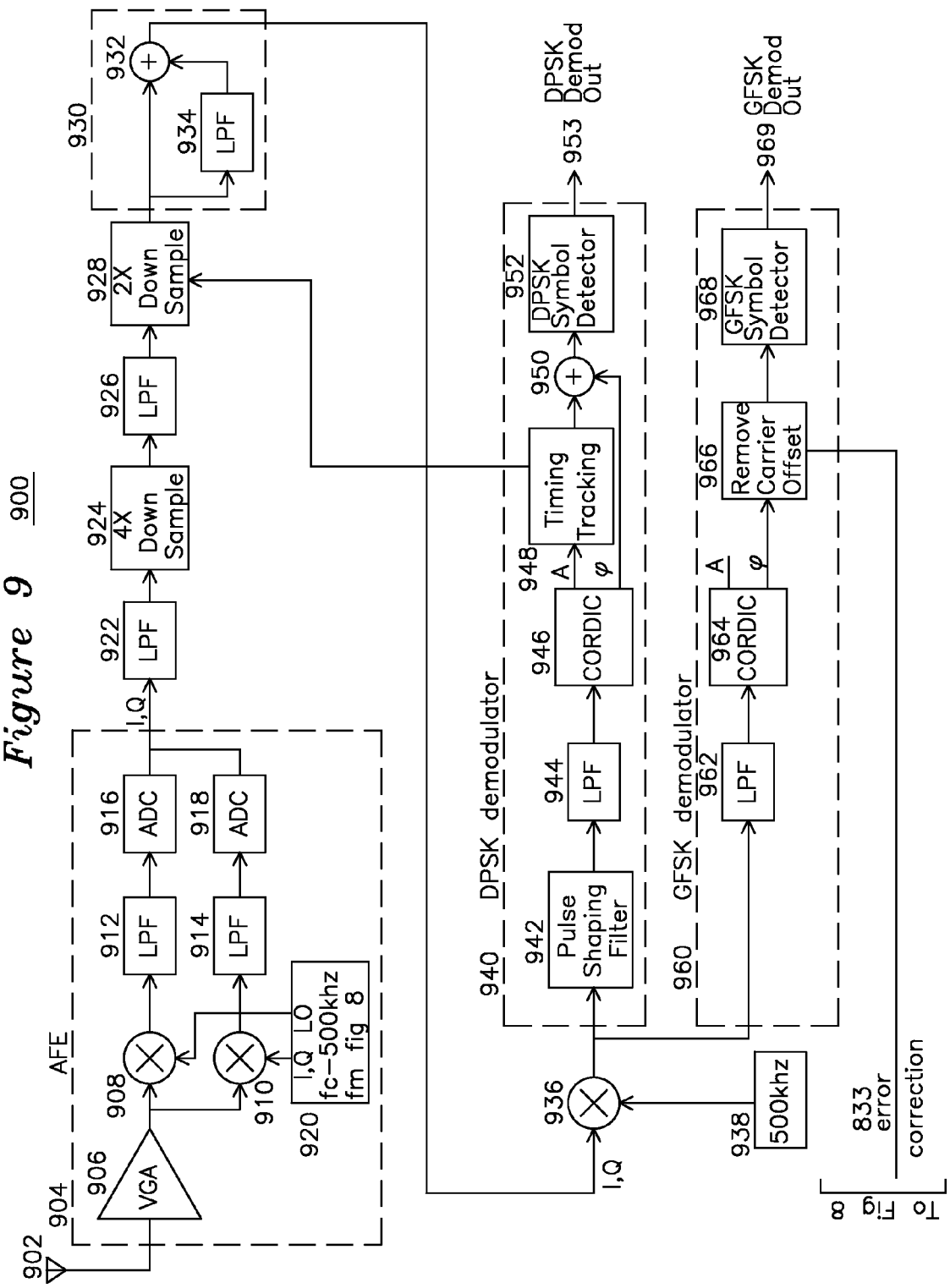

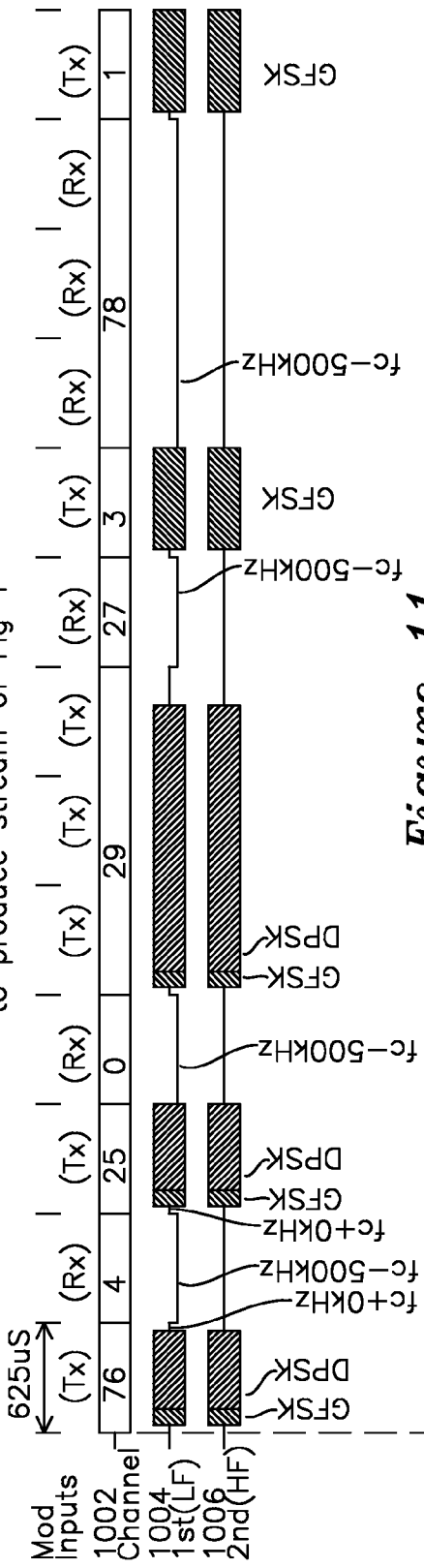
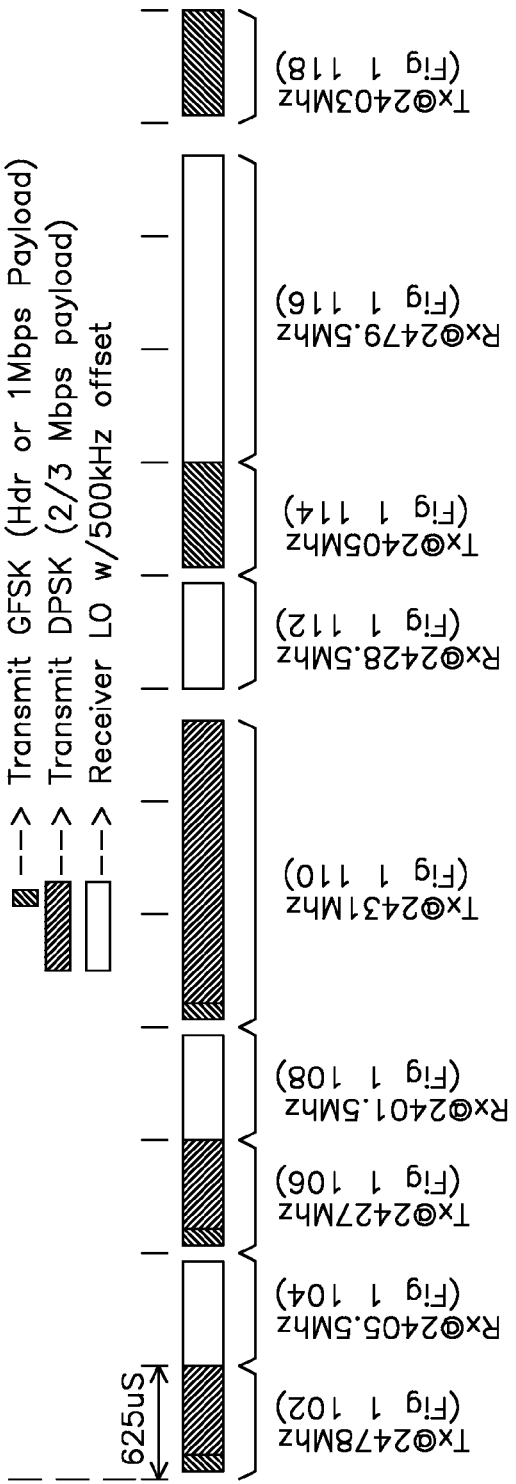

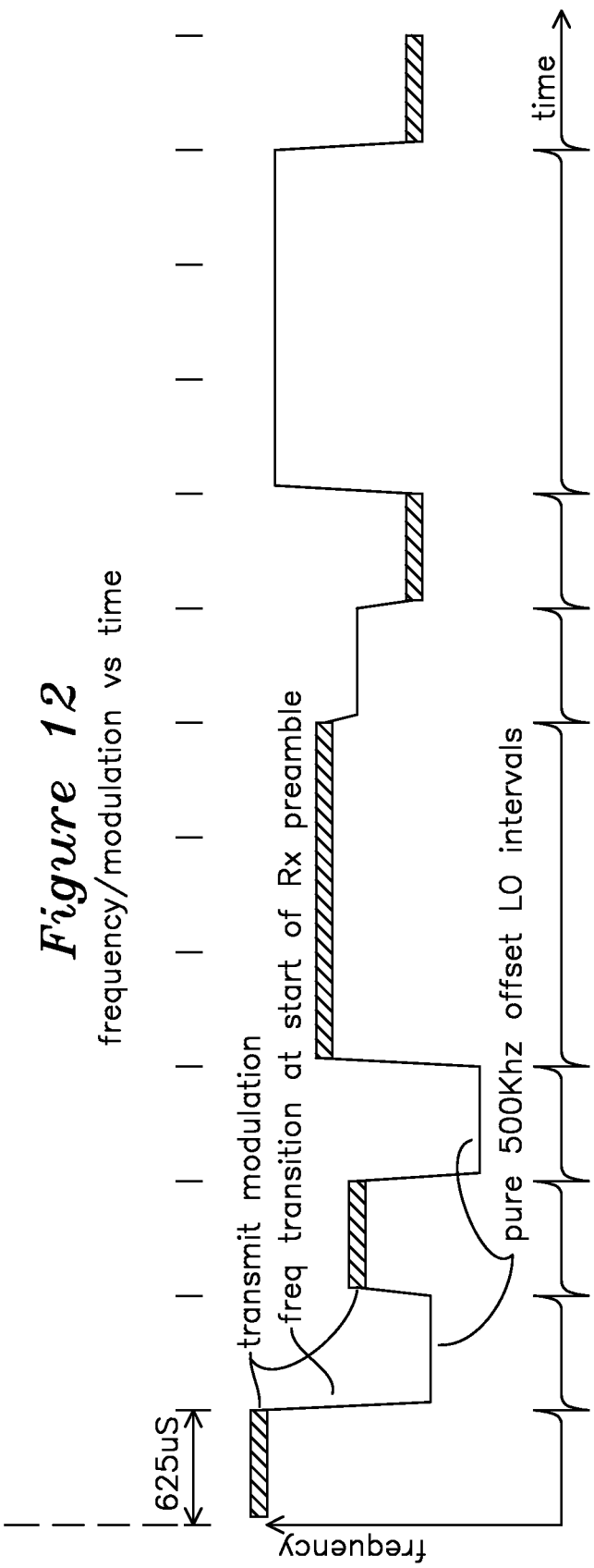

modulator Tx/Rx operation

Receive frequency offset & correction

EDR with D1,D2 Path Comp

EDR without Path Comp

Path Delay Equalizer clock interpolator, mod input generation example where sysclk=64Mhz; ext_clk=26Mhz (64)=system clk domain   (EXT)=ext clk domain

POLAR MODULATOR WITH PATH DELAY COMPENSATION

RELATED APPLICATION

This application claims the priority benefit of U.S. Provisional Application Ser. No. 61/061,103 filed Jun. 12, 2008.

BACKGROUND

Embodiments of the inventive subject matter generally relate to the field of wireless communication systems, and, more specifically, to a delay compensator for a two-point polar modulator.

Wireless communication systems transfer data from a transmitting station to one or more receiving stations using modulated radio frequency (RF) signals. Bluetooth® systems are wireless communication systems governed, in part, by the Bluetooth® Special Interest Group (SIG) which publishes specifications and compliance standards. Bluetooth® devices use a communication protocol where variable length packets are sent at a particular carrier frequency (also known as hop frequency). The hop frequency varies in a pseudo-random manner from one packet to the next over 80 frequency channels with 1 MHz separation per channel. The channels span the industrial, scientific and medical (ISM) frequency range from 2.4 GHz to 2.4835 GHz including edge guard bands. Each packet is transmitted in one or more contiguous 625 us time slots, where one device is a "master" which transmits or receives in even time slots, and one or more other devices are "slaves" which send or receive in odd time slots. For a packet using the "basic rate" of 1 Mb/s, the modulation type is Gaussian frequency shift keying (GFSK). Additionally, an "enhanced data rate" mode is available, where each 1 us interval can be modulated using differential phase shift keying (DPSK) of 2 or 3 bits per symbol, thereby producing 2 or 3 Mb/s data rates. The Bluetooth® specification provides that packets which use the "enhanced data rates" utilize GFSK for a first part of the packet, and DPSK for a second part of the packet which follows shortly thereafter.

SUMMARY

Various embodiments are disclosed of a modulation system. According to one embodiment, the modulation system includes a signal processing unit and a modulator. The signal processing unit is operable to generate a low frequency modulator signal, a high frequency modulator signal, and a modulator amplitude control signal. The modulator is coupled to the signal processing unit and operable to generate a modulated signal based, at least in part, on the low frequency modulator signal, the high frequency modulator signal, and the modulator amplitude control signal. The signal processing unit comprises a delay compensation unit operable to delay the generation of the high frequency modulator signal and the modulator amplitude control signal based, at least in part, on signal generation and modulation path delays associated with the low frequency modulator signal.

BRIEF DESCRIPTION OF THE DRAWINGS

FIG. 9 is a block diagram of one embodiment of a receiver having a first frequency conversion and a second frequency conversion;

FIG. 10 is a timing diagram of one example of modulator inputs received during modulator transmit and receive time intervals;

FIG. 11 is a timing diagram of one example of the modulator output produced by the modulator inputs of FIG. 10;

FIG. 12 is a timing diagram of one example of a frequency versus time plot for the modulator of FIG. 8;

DESCRIPTION OF EMBODIMENT(S)

The description that follows includes exemplary circuits, systems, and methods that embody techniques of the present inventive subject matter. However, it is understood that the described embodiments may be practiced without these specific details. For instance, although examples refer to transceiver components for processing Bluetooth® signals, in other embodiments, the transceiver components may be used to process other RF signals. In other instances, well-known structures and techniques have not been shown in detail in order not to obfuscate the description.

Figure 1:
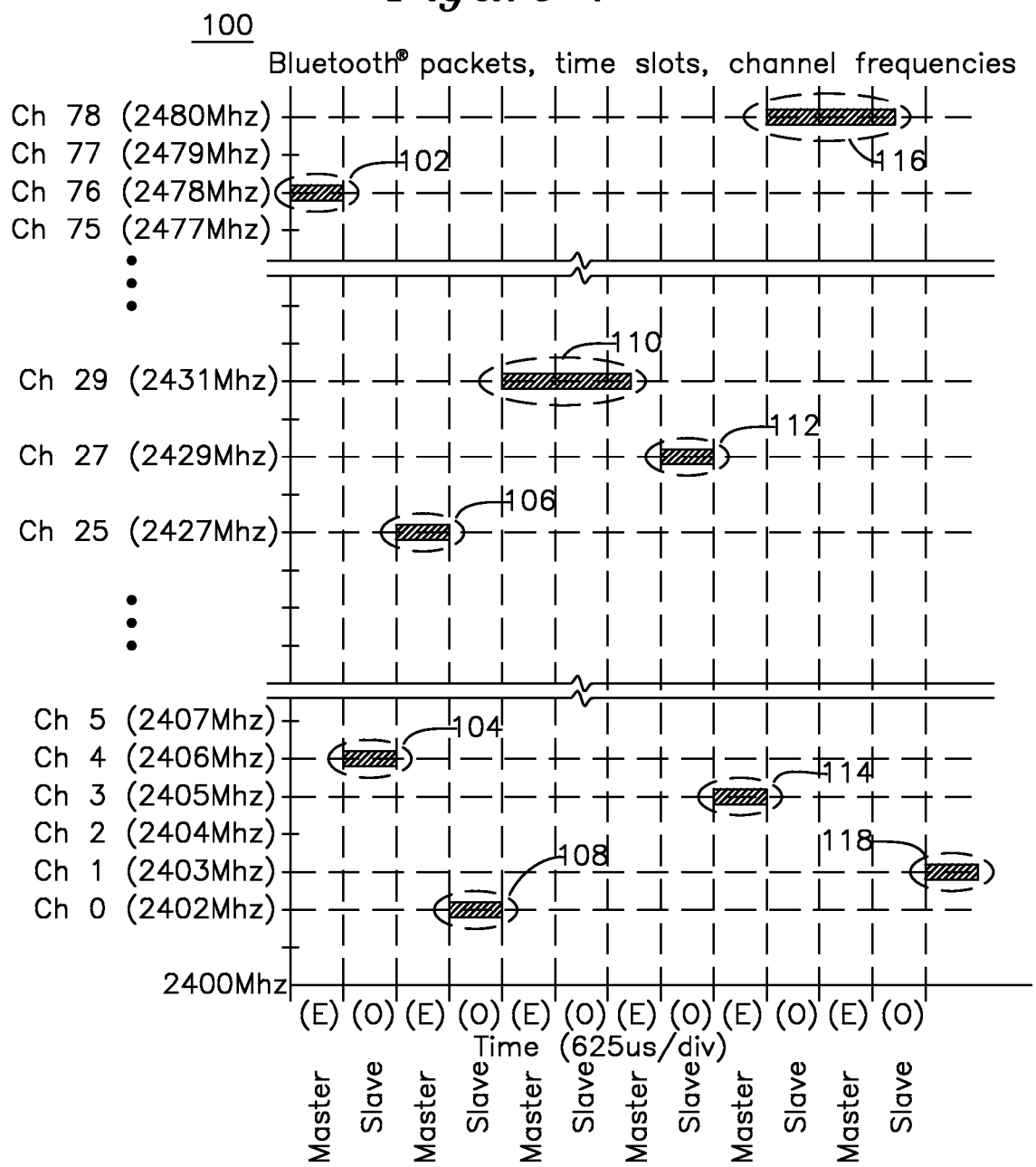
FIG. 1 is an example time and frequency diagram for packets in a Bluetooth® communications system.

FIG. 1 is an example frequency versus time diagram 100 for a Bluetooth® master device communicating with a slave device. In this example, variable length packets occupy one or more 625 us time slots in an alternating fashion, whereby a master device transmits data which begins during an even-numbered time slot noted as (E), and a slave device transmits data which begins during an odd numbered time slot noted as (O). Each packet transmission is aligned to the start of a time slot, although the packet transmission time depends on packet payload size, and may be shorter or longer than a single time slot. The frequency spectrum is divided into 79 channels starting with channel 0 at 2402 MHz, and each channel frequency is separated from the next by 1 MHz. Each packet is transmitted on a single frequency slot for the duration of the packet, which may span one or more time slots. For example, packet 108 is shown as being transmitted by a slave device on channel 0 (2402 MHz), whereas packet 110 is transmitted by a master device and spans more than 2 time slots. The sequence of frequency hops may be governed by a pseudo random sequence known to the master and slave. The modulation performed for a particular packet may be either GFSK or DPSK, as will be described further below.

Figure 2:
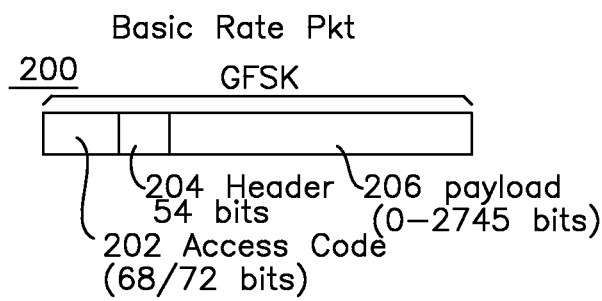
FIG. 2 is an example diagram of a basic rate Bluetooth® packet.
Figure 3:
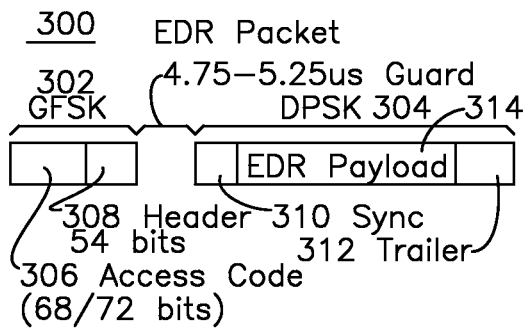
FIG. 3 is an example diagram of an enhanced data rate Bluetooth® packet.

FIG. 2 shows an example "basic rate" packet 200 which has a 1 Mbps data rate and uses GFSK to modulate packet data including an access code 202, a header 204, and a variable length payload 206. FIG. 3 shows an example "enhanced data rate" (EDR) packet 300 for 2 Mbps or 3 Mbps comprising a first part 302 and a second part 304. The first part 302 of the packet includes an access code 306 and header 308 modulated with GFSK, and followed by a short guard interval. The second part 304 of the packet includes a synchronization pattern 310, an EDR payload 314, and a trailer 312, all of which are modulated using DPSK in a 4-constellation pattern for 2 Mbps or an 8-constellation pattern for 3 Mbps.

Figure 4A:
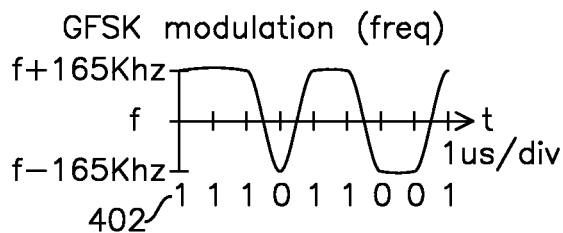
FIG. 4A is an example time versus frequency plot for GFSK modulation of a data sequence.
Figure 4B:
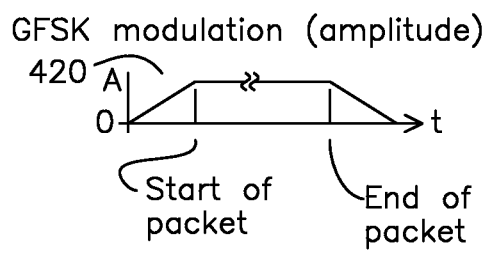
FIG. 4B is an example time versus amplitude plot for the GFSK data sequence of FIG. 4A.

FIGS. 4A and 4B show example frequency and amplitude plots versus time for GFSK modulation of a data sequence. As illustrated, the carrier amplitude waveform 420 is constant over the example data pattern 402 "111011001", and the modulation frequency is offset approximately +165 Khz for a "1" and −165 Khz for a "0" in 1 us symbol intervals. The use of Gaussian frequency shifts rather than discrete frequency shifts may reduce the modulation sidelobe energy which could spill from the current channel into an adjacent channel and cause interference with other devices using the adjacent frequency channels.

Figure 5A:
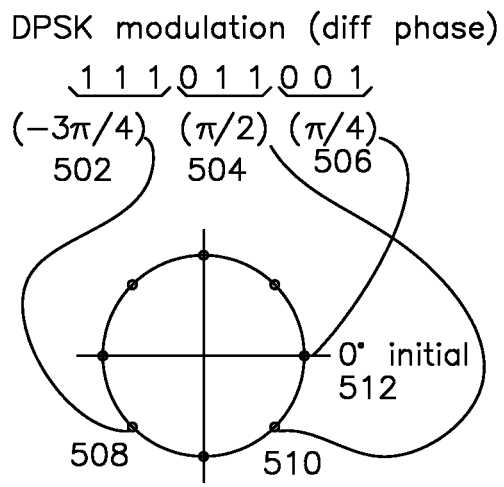
FIG. 5A is an example phase plot for DPSK modulation and the data sequence of FIG. 4A.
Figure 5B:
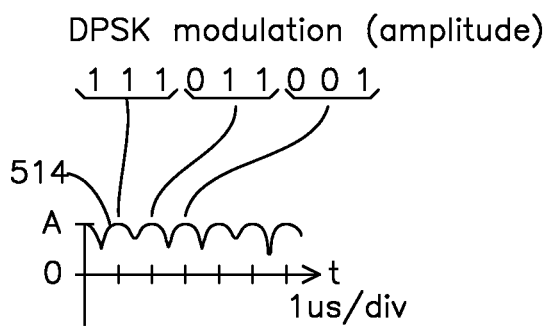
FIG. 5B is an example amplitude versus time plot for DPSK corresponding to the modulation sequence of FIG. 5A.

For DPSK modulation rates of 2 Mbps or 3 Mbps, either two or three bits of data are encoded with one of four or one of eight phase shifts, respectively. FIGS. 5A and 5B show one example DPSK modulation with respect to the previous example data 402 "111011001", where each symbol "111" "011" "001" is transmitted as one of eight differential phase shifts, which are phase shifts relative to the previous phase position. The Bluetooth® specification maps "111" 502 to −3π/4, "011" 504 to +π/2, and "001" 506 to +π/4. The modulation accomplishes this by transmitting the associated differential phase every 1 us, thereby accomplishing the transmission of 9 bits of data in 3 us, using the phases shown in FIG. 5A, starting from initial phase 512. FIG. 5B shows waveform 514 which illustrates the amplitude of a DPSK signal versus time, according to one example.

Figure 6:
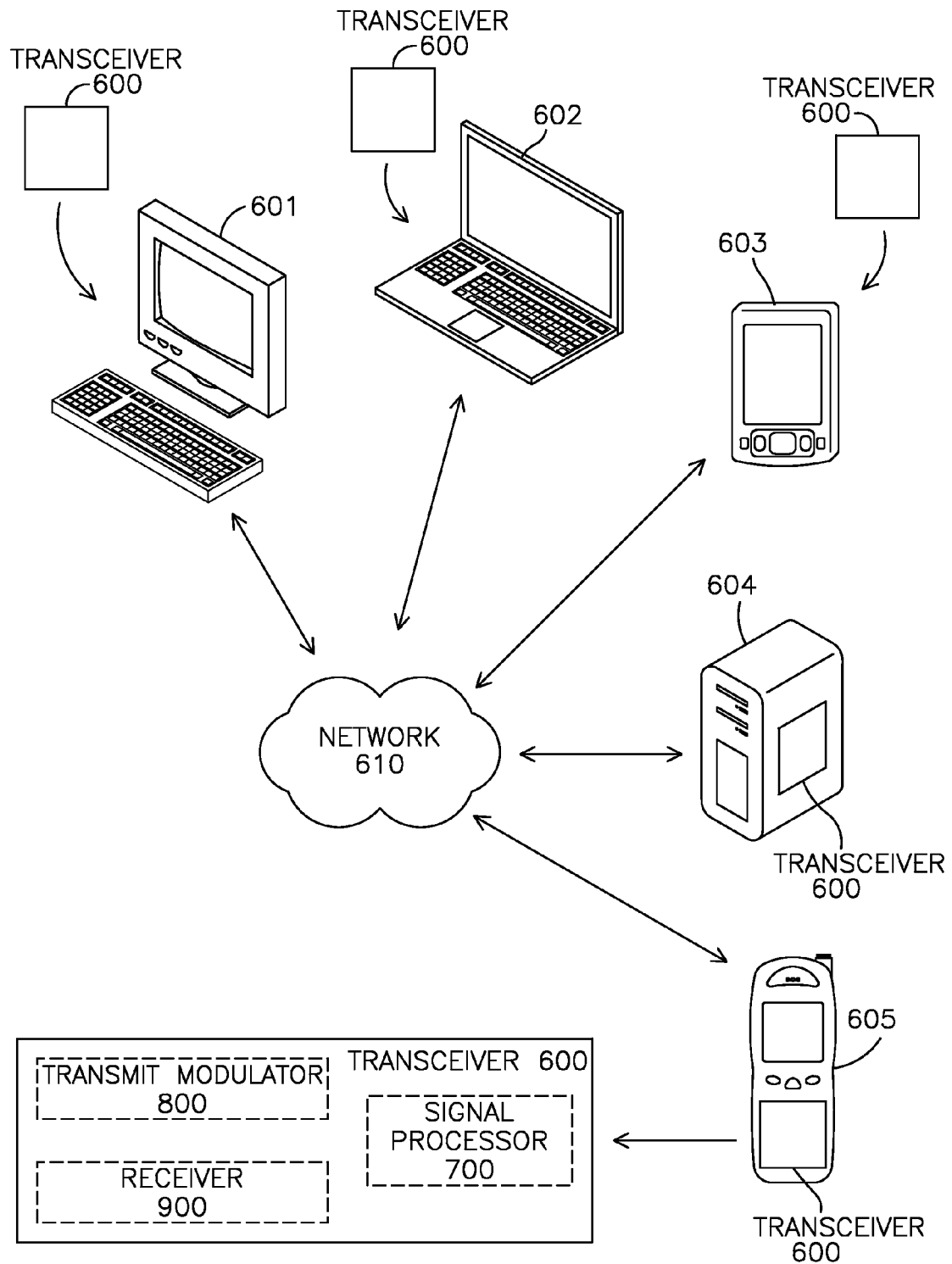
FIG. 6 is a diagram of one embodiment of a transceiver in a communication system.

FIG. 6 is a diagram of one embodiment of a transceiver 600 in a communication system. The transceiver includes a signal processor 700, a transmit modulator 800, and a receiver 900. During operation, the transmit modulator 800 receives a plurality of input signals from the signal processor 700. The transmit modulator 800 is operable as a modulator and transmitter, and also as a local oscillator (LO) signal generator. During transmit time intervals, the modulator 800 generates modulated signals for transmission, and during receive time intervals, the modulator 800 generates a local oscillator (LO) signal for the receiver 900 to be used for demodulating received signals, as will be described further below. The modulator may adjust the LO signal to compensate for a detected difference in center frequencies between the receiving and transmitting oscillators.

As illustrated, the transceiver 600 may be included in a variety of communication devices, such as personal computer (PC) 601, laptop 602, global positioning system (GPS) device 603, server 604, and mobile phone 605. It is noted, however, that the transceiver 600 may be included in other types of electronic devices, e.g., personal digital assistants (PDAs), video game consoles, and televisions. The transceiver 600 transmits and receives communication signals via a network 610, e.g., a wireless and/or wired communication network. In one example, the network 610 may be representative of a short-range communication network (e.g., a personal area network) and the transceiver 600 may be configured to transmit and receive Bluetooth® signals via the network 610.

It should be noted that the components described with reference to FIG. 6 are meant to be exemplary only, and are not intended to limit the invention to any specific set of components or configurations. For example, in various embodiments, one or more of the components described may be omitted, combined, modified, or additional components included, as desired. For instance, although shown as separate blocks in FIG. 6, in some embodiments there may be overlap in one or more of the components of the signal processor 700, transmit modulator 800, and/or the receiver 900.

Figure 7:
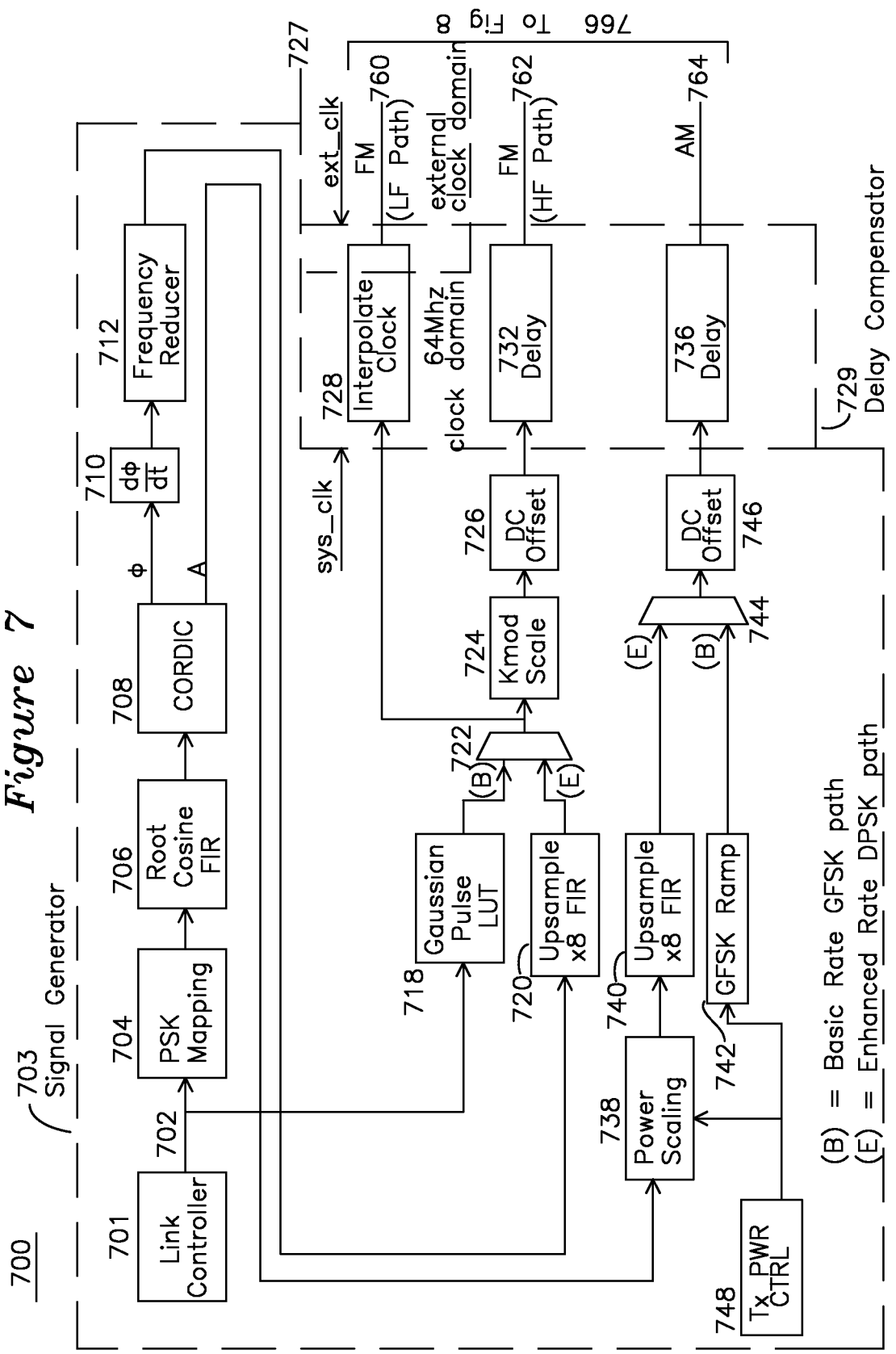
FIG. 7 is a block diagram of one embodiment of a signal processor.
Figure 8:
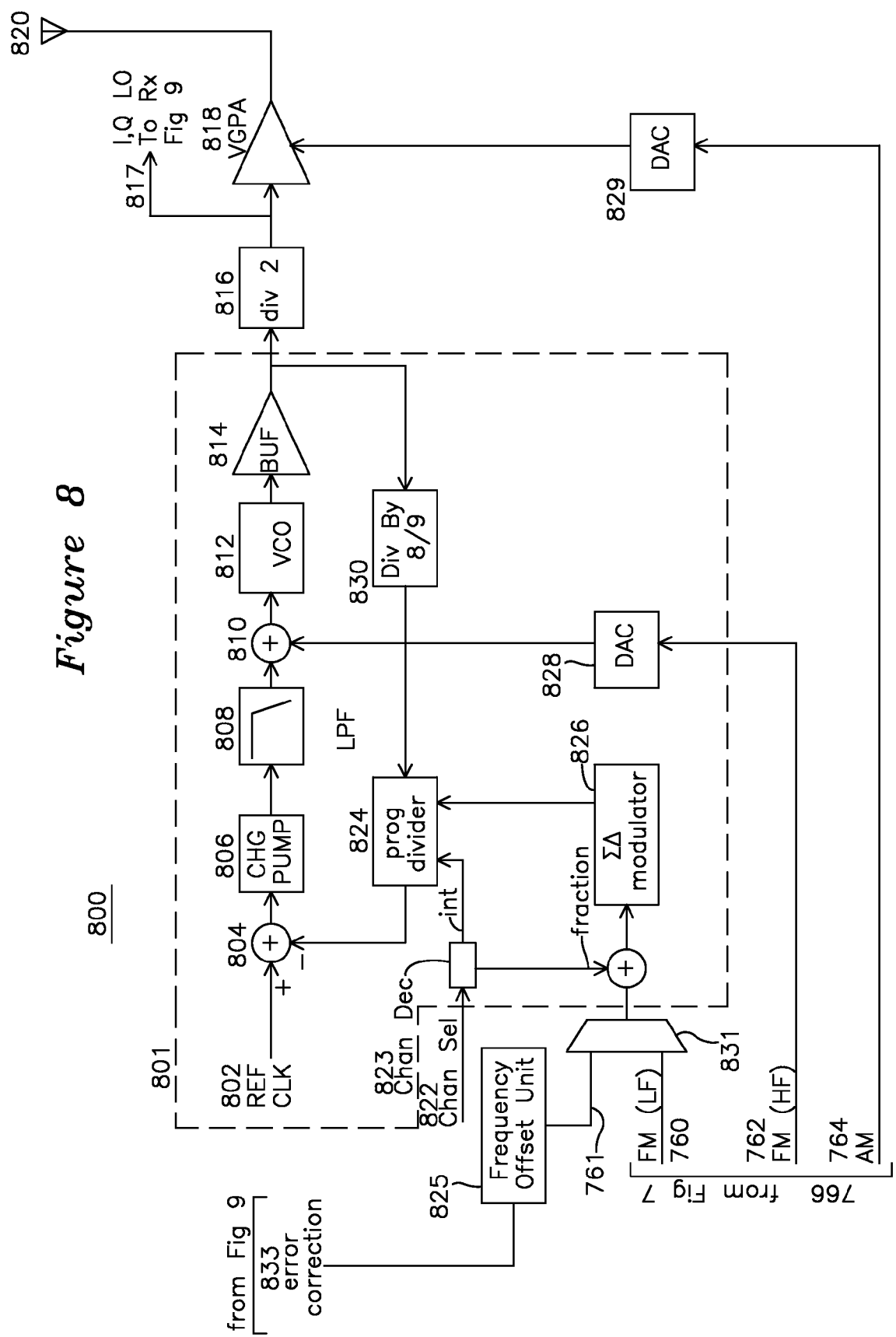
FIG. 8 is a block diagram of one embodiment of a transmit modulator which also generates a receiver local oscillator.

FIG. 7 shows a block diagram of one embodiment of a signal processor 700 for use with a modulator, e.g., transmit modulator 800 of FIG. 8, which produces wireless signals for transmission. In various implementations, the signal processor 700 and the modulator 800 can be included within a transceiver (e.g., transceiver 600 of FIG. 6) operable to transmit and receive wireless signals (e.g., Bluetooth® signals) via a network. The signal processor 700 includes support for basic rate modulation, for which the multiplexer path is shown as (B), and enhanced data rate, for which the multiplexer path is shown as (E). The signal processor 700 generates a plurality of signals including a first modulation input 760, a second modulation input 762, and an amplitude control input 764. As illustrated in FIG. 7, in one example, the signal processor 700 includes a signal generator 703 for the generation of modulation signals from a link controller 701, and a delay compensator 729 which provides time-compensated modulator input signals to the modulator 800 of FIG. 8. The delay compensator 729 provides the first modulation input 760, the second modulation input 762, and the amplitude control input 764 to the modulator 800 of FIG. 8. Furthermore, these signals may be asserted during the duration of a packet which may be modulated at a channel frequency fc determined by channel select input 822.

Basic rate GFSK packets and the GFSK first part of enhanced data rate packets are processed via the multiplexer path shown as (B) in FIG. 7. In one example, the (B) inputs of multiplexers 722 and 744 may be selected, and link controller 701 may provide a stream of 1 Mb digital baseband data 702. The low frequency modulator first input 760 is active along with the modulator amplitude control input 764, which ramps up at the start of packet GFSK modulation and ramps down at the end of GFSK modulation. The modulator first input 760 is formed by generating a Gaussian time domain generator 718, which may function as a lookup table (LUT), and provides a Gaussian frequency modulation waveform to multiplexer 722. The Gaussian frequency modulation pulse from multiplexer 722 is interpolated by interpolator 728 crossing clock domain boundary 727 from a system clock rate, such as 64 Mhz, on a first clock domain to an external modulator clock rate on an external clock domain, such as a clock rate for use by the modulator 800 of FIG. 8. As illustrated, the first delay 732, which is operative on the second modulation input data, and the second delay 736, which is operative on the amplitude control data, are part of the delay compensator 729b which provides path delay compensation for the modulation inputs with respect to the output of the modulator 800. Additionally, the delay compensator 729 includes a clock interpolator 728 which provides clock adaptation from the system clock (sys_clk) domain of the signal generator 703 to the external clock (ext_clk) domain of the modulator 800. In other words, the interpolator 728 may be included because the digital signal processing leading to the interpolator 728 is operative on the system clock domain, such as 64 Mhz, whereas the modulator first input signal 760 is operative on an unrelated external clock domain, which may be any frequency suitable for operation of the modulator 800 of FIG. 8, including external clocking frequencies of 12 MHz, 13 MHz, 19.2 MHz and their multiples 24 MHz, 26 MHz, 38.4 MHz, 52 MHz, as well as 40 MHz, or an external clocking frequency within 5% of any of these frequencies.

The amplitude output control 764 is derived from a power control 748, which establishes a desired transmit power level. The GFSK ramp function 742 ramps up to the desired transmit power level at start of packet, and ramps down at end of GFSK modulation time. A DC offset correction is then performed via DC offset unit 746. After DC offset unit 746, the signal is delayed by the second delay unit 736. The first delay unit 732 and the second delay unit 736 provide programmable static time delays to outputs of DC offset units 726 and 746, respectively, to compensate for modulator path differences and signal generator path differences in the generation of the modulator control signals for the modulator 800, and ensure time coherent alignment between the signals 760, 762, and 764 as viewed at the output 820 of the modulator 800.

For the DPSK second part of enhanced rate data packets, in one example, a stream of 2 Mbps or 3 Mbps digital baseband data 702 is provided to PSK mapping unit 704 to map the data into phase shift keying symbols. A root cosine filter 706 forms the envelope shaping of the phase encoded symbols. A CORDIC (COordination Rotation Digital Computer) 708 transforms the phase encoded symbols comprising real and imaginary (I and Q) components into corresponding phase and amplitude outputs ($\phi$,A). A differentiator 710 generates the first derivative of phase with respect to time by subtracting adjacent digital samples to form a frequency component. The frequency component is delivered to a frequency reducer 712 which limits frequency excursions. In one example, the frequency reducer 712 is a 5-tap FIR with coefficients [1 1 1 1 1]/5. The frequency component from frequency reducer 712 is then upsample filtered by upsample FIR unit 720. After the (E) path inputs to the multiplexer 722 are selected, the signal is scaled by Kmod scale unit 724, the DC components are added or subtracted by DC offset unit 726 to remove offsets, and the result is fed to the first delay unit 732. The first delay unit 732 compensates for static processing delays so that the modulator second input 762 is time aligned to the output 820 of the modulator 800 of FIG. 8, as described earlier.

The modified amplitude component (A) is provided to power scaling 738, which uses power input 748 to establish a peak amplitude envelope. The amplitude is upsampled using upsample FIR unit 740, and the DC offsets may be removed by DC offset unit 746. The result is then delayed by the second delay unit 736 to match the time coherency of modulator amplitude input 764 to the modulator first input 760 and modulator second input 762, as measured at the output 820 of the modulator 800.

FIG. 8 shows a block diagram of one embodiment of a transmit modulator 800 including a synthesizer 801. As illustrated, the synthesizer 801 includes a voltage controlled oscillator (VCO) 812 coupled to an optional buffer 814, a first programmable divider 830 and a second programmable divider 824. The output of the second programmable divider 824 is subtracted 804 from reference clock 802 and provided to charge pump 806 to form an error voltage, such as by adding or removing charge from a capacitor. The charge pump 806 output is low pass filtered using a programmable low pass filter (LPF) 808, which can be set to various bandwidths, e.g., 300 Khz. The output of the LPF 808 is added 810 to the analog converted (via DAC 828) modulator second input 762 to generate the input voltage for the VCO 812. It is noted, however, that in other embodiments the VCO 812 may have separate inputs responsive to the LPF 808 output and the DAC 828 output. It is further noted that the VCO 812 may be configured to operate at various frequencies, e.g., 4.8 GHz.

The second programmable divider 824 is programmed by an output of the channel decoder 823 and the sigma-delta ($\Sigma\Delta$) modulator 826. In one embodiment, a channel select signal 822 received by channel decoder 823 may select one of the available transmission channels, e.g., one of the available Bluetooth® channels. The channel decoder 823 provides an integer portion to the programmable divider 824 and a fraction portion that is summed with the modulator first input 760. The sum of the fractional portion and the modulator first input 760 is provided to the sigma-delta modulator 826. In one implementation, the particular integer and fractional values may be related to the selection of the reference clock 802 (i.e., reference clock frequency), as well as the configuration of dividers 824, 830, and sigma-delta modulator 826.

The first programmable divider 830 divides the output of the optional buffer 814. In one embodiment, the first programmable divider 830 may be a dual modulus divider dividing by eight or nine as may be required to configure the output of the second programmable divider 824 to be relatively close to the approximate frequency of the reference clock 802.

As described above, in one embodiment, the second modulation input 762 is converted by DAC 828 to an analog signal and added 810 to the input of VCO 812. In another embodiment, the analog signal may be applied to a separate input of the VCO 812. Furthermore, in one embodiment, amplitude control input 764 is converted by DAC 829 to an analog signal and applied to variable gain power amplifier (VGPA) 818. During a transmit interval, the buffered 814, divided 816 (e.g., divide by 2), and amplified 818 output of the VCO 812 is provided to antenna 820 for transmission. The amplitude control input 764 thereby controls the amplitude of the transmitted signal.

For basic rate packets containing GFSK and enhanced rate packets containing a GFSK part and a DPSK part, a modulation method referred to as two-point modulation is used, whereby the first (in this case a low frequency) modulator input 760 and the second (in this case a high frequency) modulator second input 762 are both applied to the VCO 812 on opposite sides of the LPF 808, which changes the frequency response at the output of the modulator 800. If the filter response is H(f), the first input $X_{lf}$ and second input $X_{hf}$, then $Y_{out}$ as the synthesizer output may be described by:

$$Y_{out} = H(f)*X_{lf} + (X_{hf}*(1-H(f))) \quad \text{(equation 1)}$$

If gains and delays are matched on the low frequency and high frequency paths such that $X_{hf} = X_{lf}$, then the output $Y_{out}$ is the same as the input $X_{hf}$ (or $X_{lf}$), regardless of the filter response H(f). This allows GFSK and DPSK symbols to be modulated using $X_{lf}$ (the modulator first input 760) and $X_{hf}$ (the modulator second input 762) together. The response time of the modulator first input 760 may be governed by delays such as the LPF 808 response and sigma-delta modulator 826 delay, and first programmable divider 830 and second programmable divider 824 delays, whereas the modulator second input 762 incurs none of these delays over short term intervals. Typically, the amplitude of the modulation signals fed to first and second input may have a relatively greater amplitude for DPSK than for GFSK.

Of the three modulation inputs comprising channel select signal 822, first modulation input 760, and second modulation input 762 shown for the modulator 800 of FIG. 8, the inputs may have different response time delay characteristics with respect to a signal seen at the output of the variable gain amplifier 818. For example, the response time for the first modulation input 760 (and the static channel select input 822) is longer than the response time for the second modulator input 762, due, at least in part, to the delays through the interpolator 728 and the sigma-delta modulator 826.

During a receive interval, the modulator 800 of FIG. 8 may also generate a quadrature local oscillator (LO) output 817, which may be used as a local oscillator, either for mixing received signals to baseband (at channel frequency fc) or with a frequency offset from fc, such as 500 KHz, as may be required for some double conversion receivers. When a receiver attempts to receive a transmitted signal, distortion or error may occur if the center frequencies of receive demodulator and transmit modulation oscillators are not relatively close. This is sometimes referred to as a frequency error. For example, if both a Bluetooth® receiver and transmitter are configured to communicate using channel 0 (2402 MHz), but the modulation oscillator in the transmitter produces a transmit signal that is not exactly centered about 2402 MHz, then the receiver may not clearly receive the transmitted signal. Such signal transmission errors may be caused by frequency differences (errors) between transmit and receive oscillator center frequencies. For example, the frequency differences may be caused by differences in crystal oscillation frequencies used in crystal based oscillators, temperature affects, process variations, etc.

In various embodiments, for single or double conversion receivers, the first modulation input 760 may continuously track variations in frequency error arising from the reference clock 802 variations, or variations in the remote transmitter channel center frequency. For example, if a difference of 50 KHz between center frequencies of a receive local oscillator (i.e., LO output 817) and a remote transmitter center frequency is detected while receiving a packet, the difference can be reduced by introducing a correction amount through the first modulation input 760. This detected difference may be corrected during the packet reception time, and drifts in frequency may also be accommodated using the modulator first input 760. As illustrated in FIG. 8, in one implementation, for the first modulation input 760 to continuously track variations in frequency error during receive time intervals, modulator 800 includes a multiplexer 831 which receives first modulation input 760 from the signal processor 700 at one of the inputs (which is selectable during transmit time intervals), and a programmable first modulation input 761 at the other input (which is selectable during receive time intervals). In one example, the programmable first modulation input 761 is received from a frequency offset unit 825. The frequency offset unit 825 is programmed with a frequency offset value to obtain the desired frequency offset, e.g., −500 KHz, based on the reference frequency. Furthermore, when a frequency error is detected at the receiver 900, the frequency offset unit 825 is programmable with a frequency error correction value to modify the programmable first modulation input 761. In one example, the receiver 900 may program the frequency offset unit 825 via line 833.

It should be noted that the components described with reference to FIGS. 7 and 8 are meant to be exemplary only, and are not intended to limit the invention to any specific set of components or configurations. For example, in various embodiments, one or more of the components described may be omitted, combined, modified, or additional components included, as desired. For instance, the feedback loop of the synthesizer 801 may include additional components.

FIG. 9 shows a block diagram of an example of a double conversion receiver 900, also known as a Hybrid Offset Zero-IF receiver. One example of a Hybrid Offset Zero-IF receiver is described in U.S. patent application Ser. No. 12/016,995 filed Jan. 18, 2008, which application is incorporated in its entirety by reference. The double conversion receiver 900 of FIG. 9 includes first analog mixers 908, 910 for conversion to an intermediate frequency, such as 500 KHz, and a second digital mixer 936 for conversion to baseband. The first mixers 908, 910 may use a local oscillator (LO) signal provided by the modulator 800 of FIG. 8, which LO frequency is selected by the channel select input 822 in combination with the modulator first input 760 to provide a tunable offset, e.g., 500 KHz. The second mixers 936 typically use a fixed second frequency 938, such as 500 KHz. A signal, such as one received by antenna 902, is provided to a variable gain low noise amplifier (VGA) 906, which provides the in-phase (I) and quadrature-phase components associated with the signal to mixers 908 and 910, respectively. The mixers 908 and 910 receive quadrature oscillator signals such as at the channel frequency fc of the packet to be received, or at a fixed frequency offset from fc, such as 500 KHz, as shown at first local oscillator 920.

In one embodiment, the quadrature local oscillator is provided by the LO output 817 shown in FIG. 8. As illustrated, the two mixer 908 and 910 outputs are low pass filtered by LPFs 912, 914, and sampled for conversion to digital form by A/D converters (ADCs) 916 and 918. In some implementations, the VGA 906, the mixers 908, 910, the LPFs 912, 914, the ADCs 916, 918 can be included within the analog front end (AFE) 904 of a receiver or transceiver. It is noted, however, that in other implementations the AFE 904 may include different components or additional components. For instance, in one embodiment, some or all of the components of modulator 800 for generating the LO oscillator signal 817, which may be used as the LO oscillator 920 in the receiver 900, can be included within the AFE 904.

In one example, the output from AFE 904 is filtered by LPF 922, down sampled by down sample unit 924, filtered by LPF 926, and down sampled by down sample unit 928. A DC removal block 930 receives the result from down sample unit 928. A LPF 934 subtracts low frequency components using adder 932, thereby producing a quadrature stream of data to second mixer 936, which may operate at a fixed frequency, e.g., 500 KHz, provided by second local oscillator 938. Double conversion systems, such as the one shown in FIG. 9, can reduce susceptibility to 1/f noise, by moving the modulation frequency components away from the DC region, thereby greatly reducing the noise components. In various implementations, since the channel frequencies of Bluetooth® transmissions are on 1 MHz carrier frequency increments, a 500 KHz offset allows the 1/f noise to be placed at one edge of the first mixer output spectrum. It is noted that in some implementations other frequency offsets such as those in the range 450 KHz to 550 KHz are satisfactory, and a mixing offset over the range of 250 KHz to 750 KHz from a Bluetooth® channel frequency may be possible with some receiver performance degradation. In yet other implementations, the design may be modified to have other center frequencies, such as 1 MHz or 2 MHz.

As illustrated, the second mixer 936 provides a baseband quadrature stream to a DPSK demodulator 940 and a GFSK demodulator 960. The DPSK demodulator 940 uses a pulse shaping filter 942 followed by a LPF 944 and CORDIC 946 to compensate for symbol rotation due to frequency offsets, which are compensated by adder 950. The resulting symbol amplitude and phase are detected by DPSK symbol detector 952, which generates the DPSK demodulated output 953. The GFSK demodulator 960 accepts the quadrature input signal stream from mixer 936, and filters the signal using LPF 962. The CORDIC 964 extracts the phase, and remove carrier offset unit 966 performs compensation of carrier offset. The result is provided to a GFSK symbol detector 968, which measures differential phase changes from symbol to symbol, thereby producing demodulated output 969.

It is noted that the receiver 900 of FIG. 9 may be implemented many different ways, including single conversion, whereby the first local oscillator 920 is at fc rather than at fc±500 khz or other offsets. Furthermore, if the receiver 900 is a single conversion receiver, it does not include second local oscillator 938 and second mixer 936. In various implementations, the receiver 900 may include processing in DPSK demodulator 940 or GFSK demodulator 960 for detection of static or dynamic frequency offsets from baseband with a correction signal provided to modulator first input 760 during receive intervals. For DPSK demodulation 940, variations in baseband frequency may have a greater impact on the error rate of detected symbols, and symbol detector 952 and associated phase correction function 948 may also examine the phase output of CORDIC 946 to generate frequency offset information to provide to the modulator first input 760 during receive intervals. Additionally, the frequency offset from expected channel frequency fc may be detected over a short interval following an access code (e.g., the tail interval shown on FIG. 14) for a first GFSK part of a packet, or over the balance of a packet following an access code part of the packet (e.g., the tail and header intervals shown on FIG. 14). In one embodiment, the receiver 900 makes a frequency offset error measurement during a tail time and optionally through the remaining GFSK part of the packet, and may apply the frequency error correction value as a static correction to the 500 Khz offset value of the programmable modulator first input prior to the DPSK part of a packet. In one example, during the tail and header intervals, the receiver 900 may implement an algorithm that takes the highest positive and negative frequency during this period of time and calculate the average of the two peaks. The frequency offset error can then be determined once the average frequency is calculated. In another example, an average frequency is calculated during the tail interval and the frequency offset error is determined based on the average frequency calculations. After the frequency error measurement operation, the receiver 900 provides a frequency error correction value to the programmable frequency offset unit 825 via line 833 to modify the modulator first input. As illustrated, in one implementation, the remove carrier offset unit 966 of the receiver 900 may determine the frequency offset error and provide the frequency error correction value to the programmable frequency offset unit 825 via line 833.

In some cases, e.g., for a signal having an information bandwidth of 1 MHz, if the output signal of the first LO is not centered exactly at 500 KHz, such as from the effect of a remote transmitter frequency offset, receiver performance is usually compromised. For example, if the first mixer output is centered below 500 KHz, DC offsets from the analog signal processing can mix into the main part of the signal, and mismatches between the in-phase and quadrature signals can start to degrade performance. Alternatively, if the first mixer output is centered above 500 KHz, the low-pass analog filters can degrade the signal, and more quantization noise from the high-pass noise shaping in the sigma-delta ADC can be added to the desired signal. To address these degradations, the DPSK signal can be mixed down to a target of 500 KHz by the first mixer using a tunable local oscillator, and get as close to the 500 KHz target as possible. The first local oscillator is designed to be tunable rather than the second local oscillator because once the signal has been processed using analog circuits with an offset in frequency, the use of a second local oscillator with a compensating frequency offset may not recover the degradation caused by the analog impairments from the first mixer. Therefore, in various implementations, such as the examples shown in FIGS. 7-9, the first local oscillator can be designed to be tunable for use with a digital second mixer which is coupled to a fixed frequency source.

It should be noted that the components described with reference to FIG. 9 are meant to be exemplary only, and are not intended to limit the invention to any specific set of components or configurations. For example, in various embodiments, one or more of the components described may be omitted, combined, modified, or additional components included, as desired. For instance, the design of one or more of the filtering stage of the receiver 900 can be changed based on specifications.

FIG. 10 shows a timing diagram of one example of the operation of the modulator 800 of FIG. 8 when operated as a transmitter modulator during transmit slots (shown as Tx), and as a receive local oscillator during receive slots (shown as Rx). During the receive slots, the modulator 800 generates a local oscillator signal 817 with an optional offset from the channel frequency fc, for example, a 500 KHz offset. It is noted that, for the example shown in FIG. 10, the packets, channels, and modulations being transmitted and received are as shown for the sequence of FIG. 1. For example, channel input 1002 contains the sequence of channel frequencies of FIG. 1. During transmit intervals, modulator first input 1004 and modulator second input 1006 contain associated GFSK modulation sections and DPSK modulation sections. As illustrated, basic rate packets utilize GFSK modulation throughout the packet. Enhanced rate data packets utilize GFSK for a first part of the packet (e.g., the header) and DPSK for a second part of the packet. Typically, the amplitudes for the first and second modulator inputs are substantially equal to each other (after scaling for digital and analog path differences), and DPSK modulation amplitudes are larger than GFSK amplitudes on the first and second modulator inputs. During transmit time slots, the modulator 800 produces transmit modulation, and during receive time slots, the modulator 800 produces fc with an optional frequency offset, e.g., 500 KHz. The fc offset is produced by adding the appropriate offset value to the modulator first input 1004. Alternatively, this offset could be produced by allowing channel input 1002 to select 500 KHz offsets from fc during receive time slots.

FIG. 11 shows a timing diagram of one example of the modulator 800 output produced by the streams of inputs shown in FIG. 10, corresponding to the transmission of packets shown in FIG. 1. Each of the 625 us time slots contains corresponding transmit (Tx) modulation or receive (Rx) local oscillator output, such as local oscillator signal 817 of FIG. 8. FIG. 12 shows a timing diagram of one example of the frequency versus time operation of the modulator 800 based on the modulator output shown in FIG. 11. Although the timing diagram illustrates ideal frequency transitions, it is noted that during frequency transitions from a receive frame to a transmit frame (and vice verse) there is typically some settling time to settle to the new frequency. It is further noted that in some implementations the modulator 800 may be powered down between receive and transmit frames (time lapse indicated by a break in the time axis). In these implementations, the modulator 800 would operate at a certain frequency during a first frame (e.g., receive frame), and after the first frame the modulator 800 would be powered down. Shortly thereafter, the modulator 800 would be turned back on for a subsequent frame (e.g., transmit frame), and the frequency would converge on its new target frequency for the frame (including some settling time).

Figure 13:
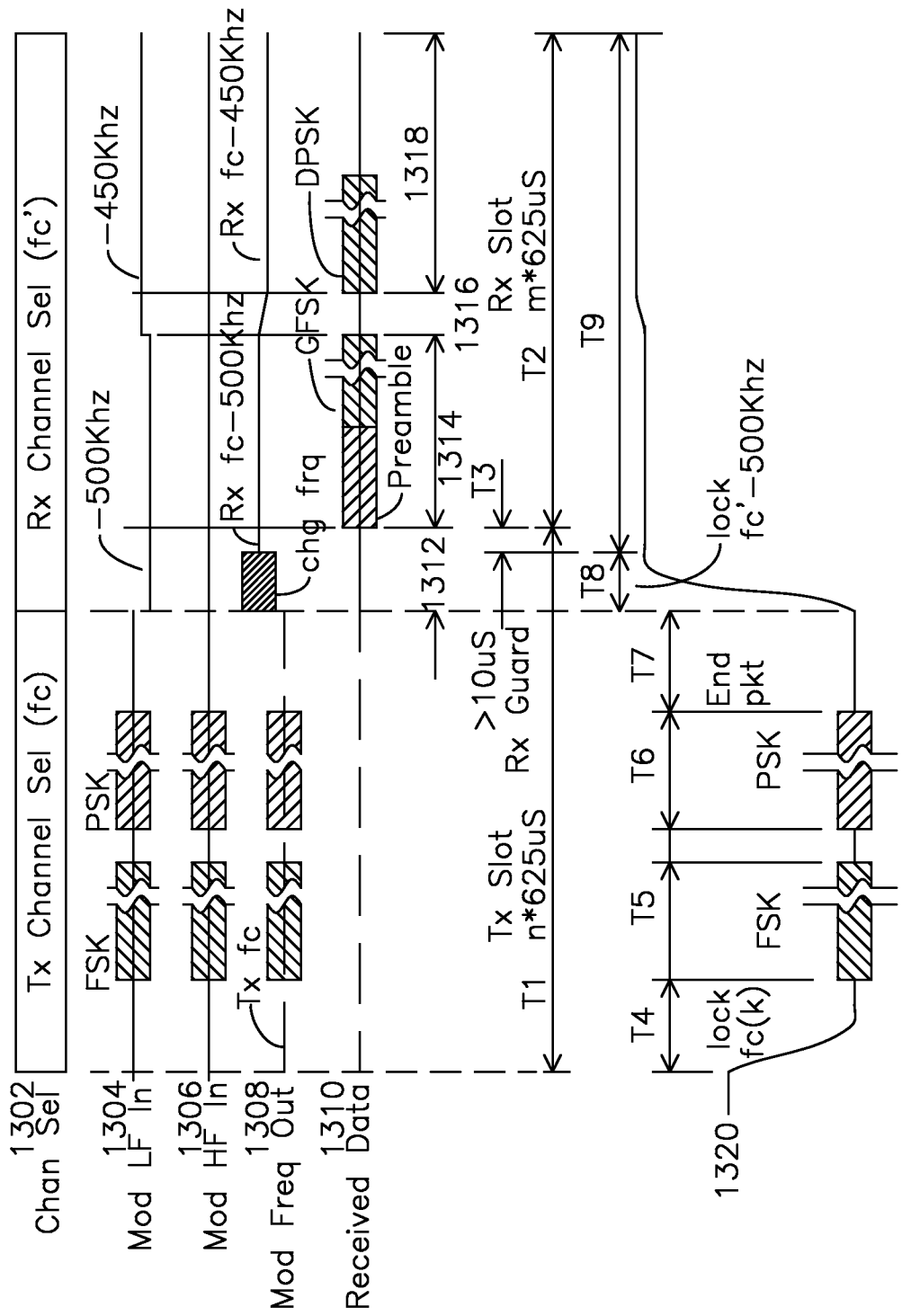
FIG. 13 is a timing diagram of one example of the operation of the modulator of FIG. 8 including transmit modulation and receive frequency settling times for FIG. 12.

FIG. 13 shows a timing diagram of one example of the modulator 800 frequency control inputs and output frequency timing with respect to a transmit slot T1 and a receive slot T2. As illustrated, in one implementation, the transmit slot T1 lasts n*625 us and the receive slot T2 lasts m*625 us, as described in the Bluetooth® standards. During a transmit interval, the channel select input 1302 is set to fc for the transmit time slot, and the modulator output frequency changes and settles to the new fc frequency in T4 lock time interval, as shown in frequency vs time plot 1320. During the T5 time interval, the FSK part of the packet is modulated using the modulator first input 1304 and modulator second input 1306. The FSK modulation is optionally followed by an enhanced data rate PSK part during the T6 time interval, and an end of packet time interval T7, as shown in plot 1320. The modulator frequency outputs are shown in summary in waveform 1308 and with additional detail in waveform 1320.

Following a transmit interval, the modulator 800 generates the local oscillator signal 817 for a receive interval, shown in FIG. 13 as the following time slot, although the time slot for packet reception could occur much later. Waveform 1320 shows a receive guard interval T3 (e.g., 10 us) added to a settling time interval T8 prior to the Rx slot T2, when the channel select 1302 selects fc' and an offset is added (e.g., 500 KHz) using modulator first input 1304. In the example shown in FIG. 13, the modulator output frequency settles to the fc' with the 500 KHz offset during time T8, which allows for an early packet reception T3 as specified in the Bluetooth® specification. During the interval 1312, the receiver waits for a packet preamble and GFSK first part of a packet, shown in interval 1314. During interval 1314, the modulator first input 1304 provides a voltage sufficient to cause a 500 KHz offset in the modulator output frequency, while the modulator second input 1306 is set to a constant value. During the preamble interval and optionally a GFSK modulation part of interval 1314, the receiver determines the frequency error for the packet being received. This frequency error is then added or subtracted from the offset at any time prior to the DPSK part of the modulation, e.g., the interval 1316, which may provide sufficient time for the modulator output frequency to settle to the corrected value prior to the DPSK part of the modulation, shown as interval 1318. In some example, a 500 KHz offset related to the double conversion architecture of receiver 900 of FIG. 9 may result in proper operation. However, in the example of FIG. 13, the receiver detects that the remote transmitter frequency is offset by 50 KHz relative to the receive frequency. The 50 KHz error is detected during interval 1314, applied at the end of interval 1314, resulting in a modulator first input offset of 450 KHz. The DPSK packet is demodulated to baseband during interval 1318 with the 50 KHz offset removed.

Figure 14:
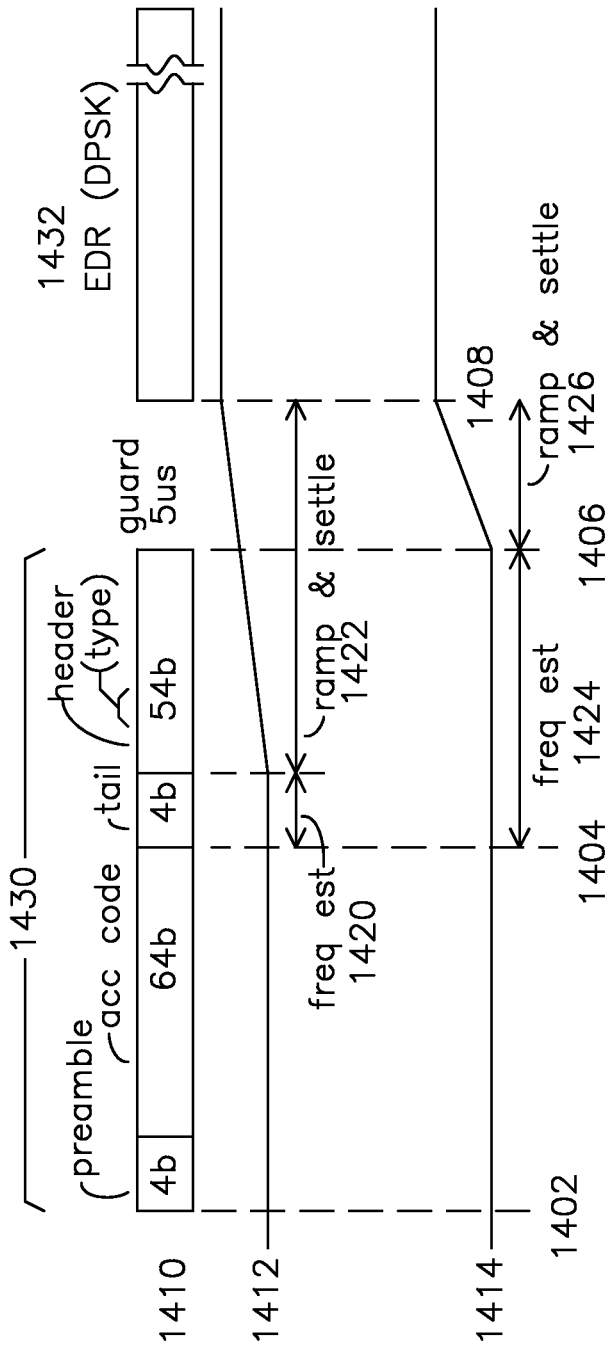
FIG. 14 is a timing diagram showing examples for correcting receiver frequency offsets.

FIG. 14 is a timing diagram showing example methods for frequency offset error correction. As described earlier, an enhanced data rate packet has a first part 1430 comprising GFSK modulation of a preamble, access code, tail, and header, and a second part 1432 comprising the DPSK modulation portion of the packet. The header includes a TYPE field, which indicates packet type. As illustrated, the start of the packet occurs at time 1402, and an estimation of frequency offset may be performed by a receiver, such as the one described in FIG. 9, during the interval from 1404 to 1406. The result of this frequency offset estimation may be subtracted from the first modulator input 760 as a correction value, thereby producing a corrected local oscillator frequency as was shown in FIG. 13, and removing the receive frequency offset. The frequency offset is applied and settled before the start of enhanced data rate portion of the packet at time interval 1408. Waveform 1412 shows a first method of correcting a receive frequency offset, whereby a frequency offset estimation is made during interval 1420 which begins after the access code part of the packet and prior to a header part of the packet (i.e., the tail interval). The estimated offset is subtracted and applied over a maximum time interval 1422, thereby minimizing the frequency change per unit time. Waveform 1414 shows a second method of correcting a receive frequency offset, whereby the frequency estimation interval 1424 extends over the remainder of the first part of the packet following the access code (i.e., the tail and header intervals), and the correction is applied and settles during the guard interval 1426.

While the first example shown in waveform 1412 benefits from the long application time of the offset 1422, the second example shown in waveform 1414 benefits from the improved frequency offset measurement accuracy related to the longer measurement interval 1424. It is noted that the apportionment of frequency estimation interval and duration of application of the offset to the first modulator input may include longer or shorter intervals than shown in the examples. Furthermore, the frequency change may be a linear ramp, or a shaped non-linear waveform, which satisfies the requirement of measurement during a first part of a packet 1430, and application of a frequency offset using a modulator control input such as a first input substantially prior to the second part of the packet 1432.

Figure 15:
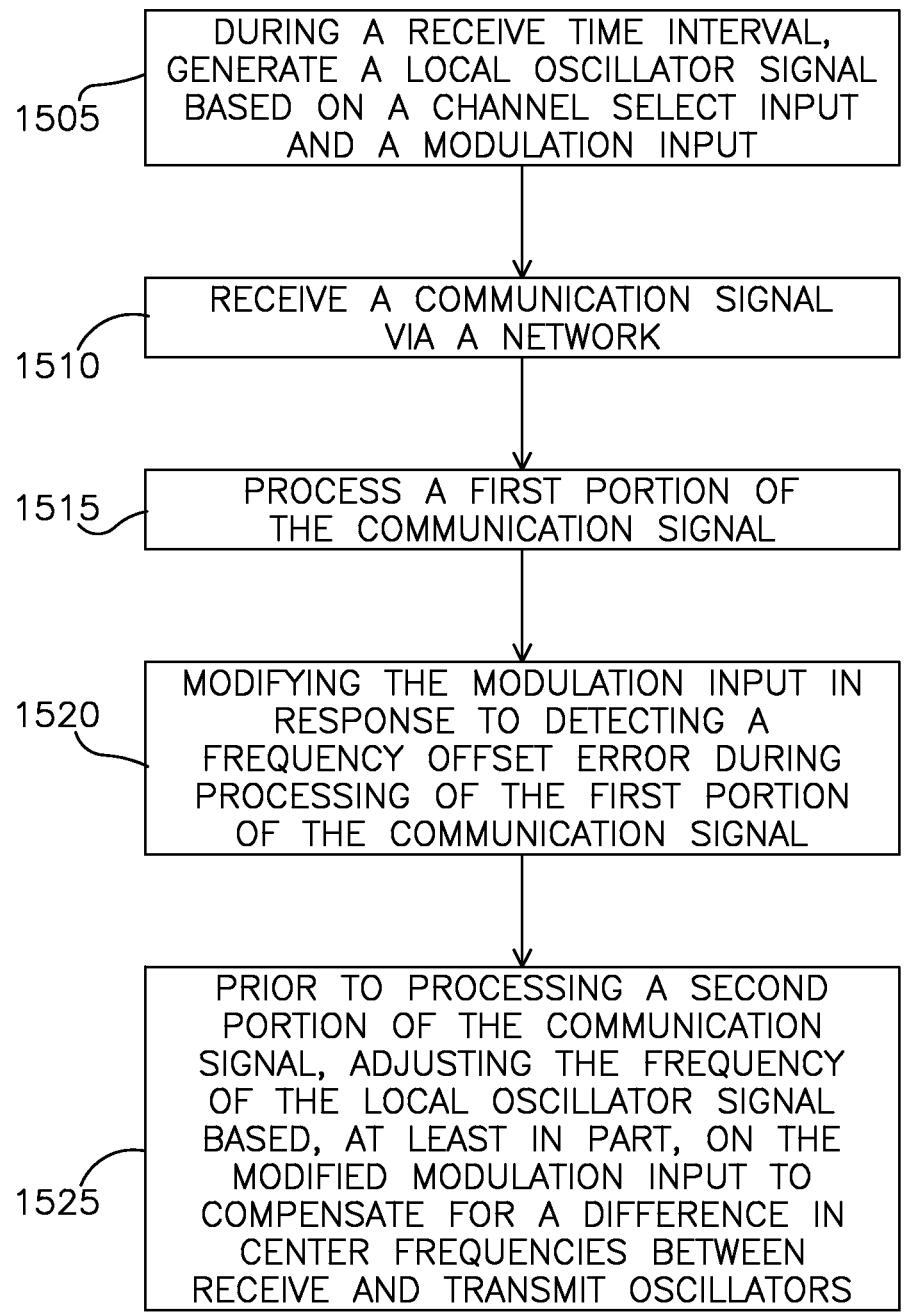
FIG. 15 is a flow diagram of one embodiment of a method for generating a local oscillator signal in a transceiver of a communication system.

FIG. 15 is a flow diagram of one embodiment of a method for generating a local oscillator signal (e.g., LO signal 817 of FIG. 8) in a transceiver (e.g., transceiver 600) of a communication system. As described previously, in one specific implementation, the transceiver 600 includes signal processor 700, transmit modulator 800, and receiver 900. The transmit modulator 800 includes a synthesizer 801 and transmitter circuitry. During operation, the transmit modulator 800 receives a channel select input and a modulation input, e.g., from the signal processor 700. A channel frequency is determined based on the channel select input, and an offset frequency is determined based on the modulation input. At block 1505, during a receive time interval, the transmit modulator 800 generates the local oscillator signal 817 based on the channel select input and the modulation input, and provides the local oscillator signal 817 to the receiver 900. At block 1510, the receiver 900 may receive a communication signal from a second transmitter (e.g., laptop 602 of FIG. 6) in a network (e.g., network 610). The communication signal includes a first portion (i.e., the GFSK modulation portion) and a second portion (i.e., the DPSK modulation portion).

At block 1515, the receiver 900 processes the first portion of the communication signal, as described above with reference to FIGS. 9-14. During processing of the first portion of the communication signal, the receiver 900 may perform frequency offset error estimation. In one example, a control unit of the receiver 900, which may be implemented in hardware and/or software, performs the frequency offset error estimation. At block 1520, in response to detecting a frequency offset error during processing of the first portion of the communication signal, the modulation input is modified based on the detected frequency offset error. At block 1525, prior to processing the second portion of the communication signal, the frequency of the local oscillator signal 817 is adjusted based, at least in part, on the modified modulation input to compensate for a difference in center frequencies between oscillators in the receiver 900 and the second transmitter, as described above with reference to FIGS. 6-14.

It should be understood that the depicted flow diagram(s) are examples meant to aid in understanding embodiments and should not be used to limit embodiments or limit scope of the claims. Embodiments may perform additional operations, fewer operations, operations in a different order, operations in parallel, and some operations differently. For instance, referring to FIG. 15, the frequency of the local oscillator signal 817 may be adjusted during processing of the first portion of the communication signal or during a guard interval between the first portion and the second portion of the communication signal.

Various embodiments are disclosed of a delay compensator for a modulator, e.g., a polar modulator, having a plurality of modulator inputs, each modulator input having a different time response. The modulator provides both frequency shift keying (FSK) and phase shift keying (PSK) for use with a transmitter. The delay compensator compensates for signal generation and modulator path delays as well as providing clock synchronization when the modulator is operative on a different clock domain than the signal generator providing the modulator inputs, as will be further described below with reference to FIGS. 16-19.

In some implementations, the modulator operative for frequency and phase modulation has a first input which accepts modulator first input which is coupled to sigma-delta modulator, a loop filter, and a controllable oscillator (VCO), a second input which accepts modulator second input that is coupled to the VCO, and a third input which accepts modulator amplitude control input that is coupled to variable gain power amplifier (VPGA) having an input coupled to the output of the VCO. The modulator can generate a frequency or phase modulated output using the first and second input together in a technique known as two-point modulation, and the amplitude control input for envelope generation. The response time from each modulator input to modulator output may be different. Therefore, in one example, the modulator first input is directly provided to the modulator, the modulator second input is provided to the modulator after a first delay, and modulator amplitude control input is provided to the modulator after a second delay. In this example, since the modulator first input has the longest modulator response time, it is directly applied from the signal processing unit to the modulator without added delay. The first delay and second delay may each include a programmable delay counter and address counter for the generation of a memory address, with each delay counter coupled to a first memory and a second memory containing the modulator second input data and modulator amplitude control data, as will be further described below.

Figure 16:
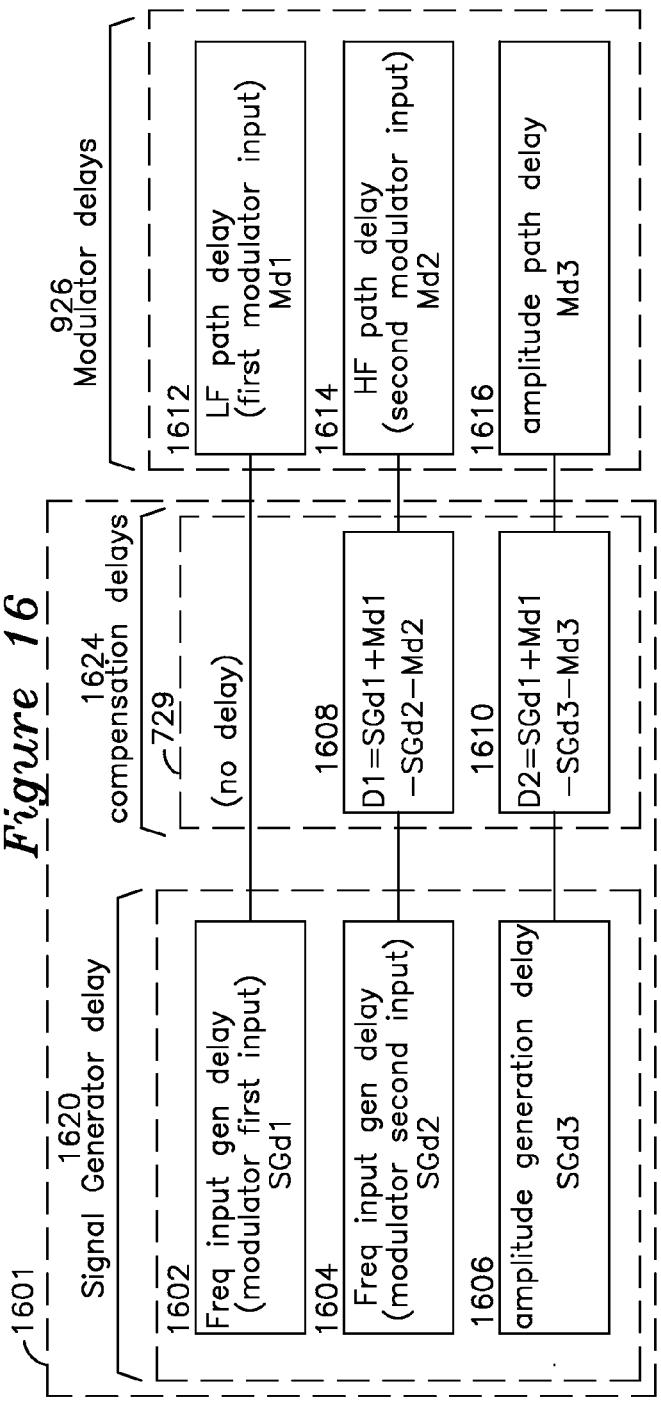
FIG. 16 is a block diagram of one embodiment of a delay compensator for providing signal generator delays and modulator delays.

FIG. 16 is a block diagram illustrating a delay compensation process implemented by the delay compensator 729 of FIG. 7 for aligning modulator input signals, according to one example. As illustrated, the delay compensator 729 introduces compensation delays 1624 into the generation of the modulator input signals to align the signals at the output of the modulator 800, i.e., the delay compensator 729 introduces a first delay 1608 (D1) into the generation of the modulator second input 762 and a second delay 1610 (D2) into the generation of the modulator amplitude control input 764.

The signal processor delay block 1601 illustrates the signal generation path delays 1620 associated with the generation of the modulator input signals. The signal generation path delays 1620 include a frequency input generation delay 1602 (SGd1) for the modulator first input 760 (LF path), a frequency input generation delay 1604 (SGd2) for the modulator second input 762 (HF path), and an amplitude generation delay 1606 (SGd3) for the modulator amplitude control input 764 (AM path). The example modulator 800 described in FIG. 8 has associated input path modulation delays 1626 for the modulator inputs, such as an LF path modulator delay 1612 (Md1) for the modulator first input 760, an HF path modulator delay 1614 (Md2) for the modulator second input 762, and an amplitude path modulator delay 1616 (Md3) for the modulator amplitude control input 764. It is noted that the amount of delay for each modulator input may depend on various configuration-specific parameters. The delay compensation process restores temporal coherency of signals arrival at the reference point of the modulator output by introducing compensation delays 1624 into the generation of the modulator input signals. Specifically, the delay compensation process provides no delay for the modulator first input 760, which has the longest response time (shown as SGd1+Md1), provides the first delay D1=SGd1+Md1−SGd2−Md2 for the modulator second input 762, and provides the second delay D2=SGd1+Md1−SGd3−Md3 for the modulator amplitude control input 764.

Figure 17B:
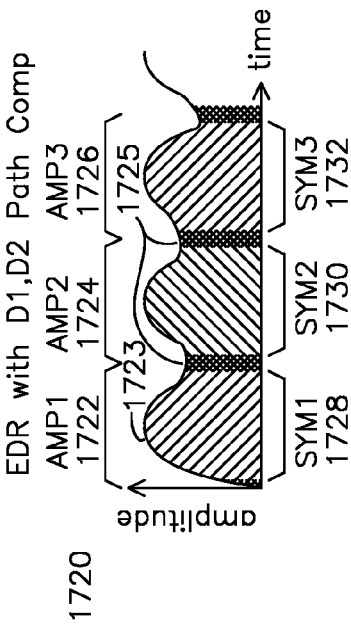
FIG. 17B shows an example modulator output waveform for an extended data rate packet with delay path compensation.
Figure 17A:
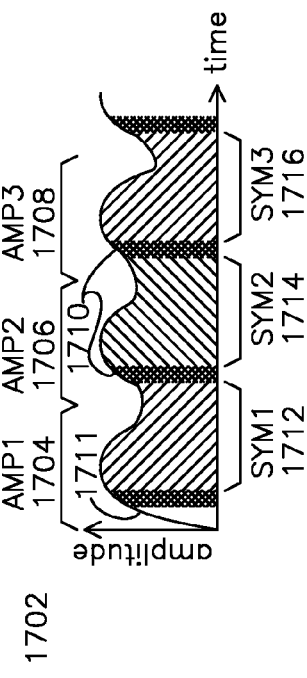
FIG. 17A shows an example modulator output waveform for an extended data rate packet without delay path compensation.

FIG. 17A shows an example of a simplified amplitude versus time diagram for enhanced data rate packets, which use DPSK for modulation of successive symbols 1712, 1714, and 1716, where no delay compensation is incorporated into the modulator signal paths. Symbols 1712, 1714, and 1716 are degraded in phase modulation purity within each symbol because of the delay between the first modulation input 760 and second modulation input 762 which form the inputs for the two-point modulator. For ideal operation, the first and second modulator inputs should have equal arrival times at the input of the VCO 812. However, without delay compensation, the modulator first and second input arrive at different times, causing the degradation of modulation purity. In one example, delay compensation is accomplished by directly applying the modulator first input 760 from the signal generator to the modulator 800, and delaying the modulator second input 762 after the signal generator using first delay unit 732. The amount of delay for the modulator amplitude control input 764 is applied after the signal generator using second delay unit 732, and may be based on the amplitude control input having a response at the modulator output which compensates for the delays between the first and second modulator inputs. Uncompensated FIG. 17A also shows inter-symbol transition times 1710 between symbols 1712, 1714, and 1716, which would ideally be located between symbols and temporally centered within the root cosine amplitude envelope of Bluetooth® modulation. The short response time of the modulator amplitude control input 764 compared to the other modulator inputs causes the uncompensated modulation envelope 1711 to be applied by the modulator earlier than the corresponding symbol windows.

The delay compensator 729 of FIG. 7, and functionally represented in FIG. 16, provides time delay compensation for the modulator second input 762 to compensate for signal generation and modulation delays experienced by the modulator first input 760, thereby substantially achieving optimal two-point modulation. The delay compensator 729 also provides time delay compensation to the modulator amplitude control input 764 to synchronize the envelope of the modulation with the first and second modulator inputs as they arrive at the output of the modulator 800. As previously described above, the modulator first input 760 has the longest time delay, i.e., the modulator first input path delay, which is calculated by adding the frequency input generation delay SGd1 and the LF path modulator delay Md1. The compensation delays 1624 D1 and D2 are applied to the modulator second input 762 and amplitude control input 764 paths, respectively. The compensation delay D1 for the modulator second input 762 is determined by subtracting the HF path modulator delay Md2 and the frequency input generation delay SGd2 from the modulator first input path delay, as shown in 1608. The compensation delay D2 1610 is similarly determined by subtracting the amplitude path modulator delay Md3 and the amplitude generation delay SGd3 from the modulator first input path delay, as shown in 1610. In this manner, the modulator inputs may be synchronized in time with respect to the output of the modulator for substantially achieving optimal two-point modulation.

FIG. 17B shows the effect of this time delay compensation at the output of the modulator 800. Symbols generated with modulator delay compensation are shown as 1728, 1730, and 1732, and have two-point modulation which includes compensation for the path delays, such that the phase modulation in each symbol is approximately ideal. Similarly, root-cosine amplitude windows 1722, 1724, and 1726 are centered in each modulated symbol, as seen in amplitude envelope 1723, which results in reducing the amplitude of spurious sidelobes generated by modulation transitions 1725.

Figure 18:
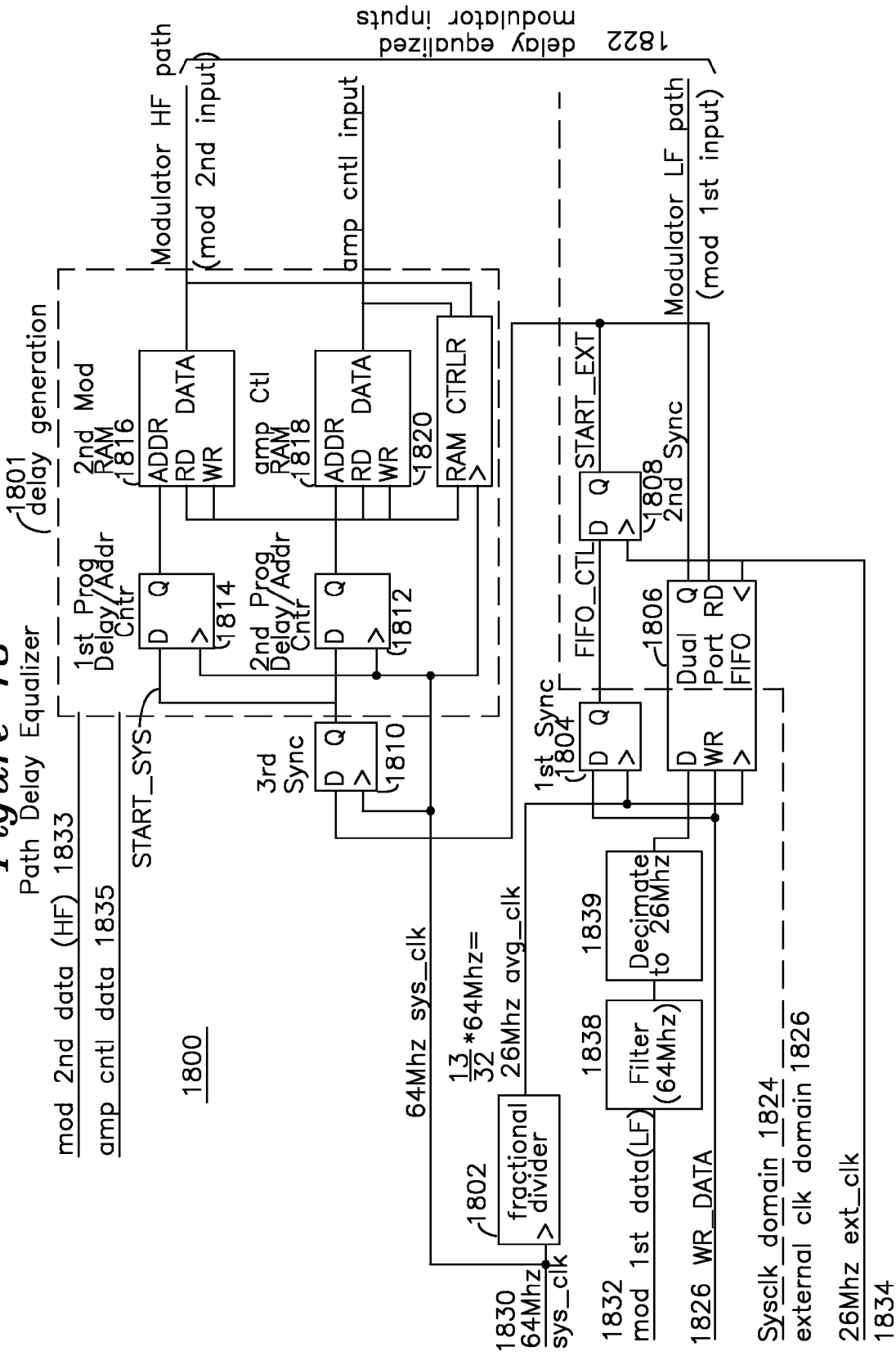
FIG. 18 shows a block diagram of one embodiment of the delay compensator.

FIG. 18 is a block diagram of one embodiment of the delay compensator 729 of FIG. 7, shown as delay equalizer 1800, for providing the time compensation delays 1624 shown in FIG. 16. The delay equalizer 1800 accepts a system clock (sys_clk) 1830 shown as 64 MHz for the present example, and an external clock (ext_clk) 1834 shown as 26 MHz in this example. In one embodiment, the external clock and system clock are independently generated clocks that are closely related in frequency by a fraction of two integers: number_of_pulses_emitted_in_interval<number_of_clock_cycles_in_interval, such that fractional divider 1802 can generate from the system clock frequency an average clock signal (avg_clk) with a frequency very close to the external clock frequency. The fractional divider 1802 is able to produce the average clock (avg_clk) output closely matching the external clock frequency from the system clock and above integers according to:

$$\text{avg\_clk\_freq} = sysclk * \frac{\text{number\_of\_pulses\_emitted\_in\_interval}}{\text{number\_of\_clock\_cycles\_in\_interval}}$$

where number_of_clock_cycles_in_interval is the number of system clock cycles generated during a particular regular interval (shown as 32 in the present example), and the number_of_pulses_emitted_in_interval is an integer less than number_of_clock_cycles_in_interval (shown as 13 in the present example). It is noted, however, that in other implementations, the system clock and/or the external clock may be at various other frequencies.

In various implementations, the system clock domain includes clocked registers, a FIFO, and counters shown in system clock domain boundary 1824, including the modulator second input (HF path) 762 and modulator amplitude control input 764, as well as all of the circuitry of the signal generator 703 shown in FIG. 7. The external clock domain 1826 includes the modulator first input (LF path) 760 and the clocked modulator functions of FIG. 8 such as the sigma-delta modulator 826, programmable divider 824, and divider 830. The delay equalizer of FIG. 18 accepts modulator first data 1832, and modulator second input data 1833 is initialized into memory unit 1816, such a random access memory (RAM). Amplitude control data 1835 is provided to amplitude control memory unit 1818, such as a RAM. It is noted, however, that in other embodiments the memory units 1816 and 1818 may be other types of memory. As illustrated, in one specific example, a controller 1820 may control the memory writes and reads with respect to memory units 1816 and 1818.

A write request (WR_DATA) 1827 is applied to the equalizer 1800, in addition to a stream of modulator first data 1832, which is filtered 1838 and decimated 1839 to the external clock rate 1834, shown in this example as 26 MHz. The output of decimator 1839 is fed to the input side of a dual port FIFO 1806 which is clocked by avg_clk, shown in this example as 26 MHz average clock rate, as provided by the fractional divider 1802 described earlier. In this example, the dual port FIFO 1806 has sufficient depth to avoid underflow during intervals when the instantaneous input clock rate from the 26 MHz avg_clk is low, and to avoid overflow during intervals when the instantaneous input clock rate from the 26 MHz avg_clk is high. Furthermore, the dual port FIFO 1806 has sufficient depth to handle accumulations or depletion of data when the avg_clk generated by fractional divider 1802 is greater or less, respectively, than the external_clock 1834 rate, which regulates the rate at which data is clocked out of the dual port FIFO 1806.

In the example shown on FIG. 18, during operation, the assertion of WR_DATA 1827 causes modulator first data 1832 to be clocked into the dual port FIFO 1806, as well as the generation of FIFO_CTL from first synchronizer 1804, which is clocked by the avg_clk output of fractional divider 1802. The FIFO_CTL output for the first synchronizer 1804 is then provided to second synchronizer 1808, which is clocked by the external clock 1834 to produce a START_EXT signal on the external clock domain 1826. The START_EXT signal is then provided to third synchronizer 1810, which synchronizes the START_EXT signal from the external clock domain 1826 to generate START_SYS on the system clock domain 1824. The START_SYS signal is used to initiate the programmable delayed output of data stored in delay generation unit 1801. In one embodiment of the delay generation unit 1801, modulator second input data 1833 is stored in memory 1816 and amplitude control data 1835 is stored in memory 1818. The START_SYS signal starts first programmable delay counter 1814 and second programmable delay counter 1812, which initially provide a programmable delay interval, and then provide incrementing addresses to the memory 1816 and the memory 1818, which generate the modulator second input (HF path) data and the modulator amplitude control input, respectively, of outputs 1822, which are accompanied by modulator first input (LF path) data.

Figure 19:
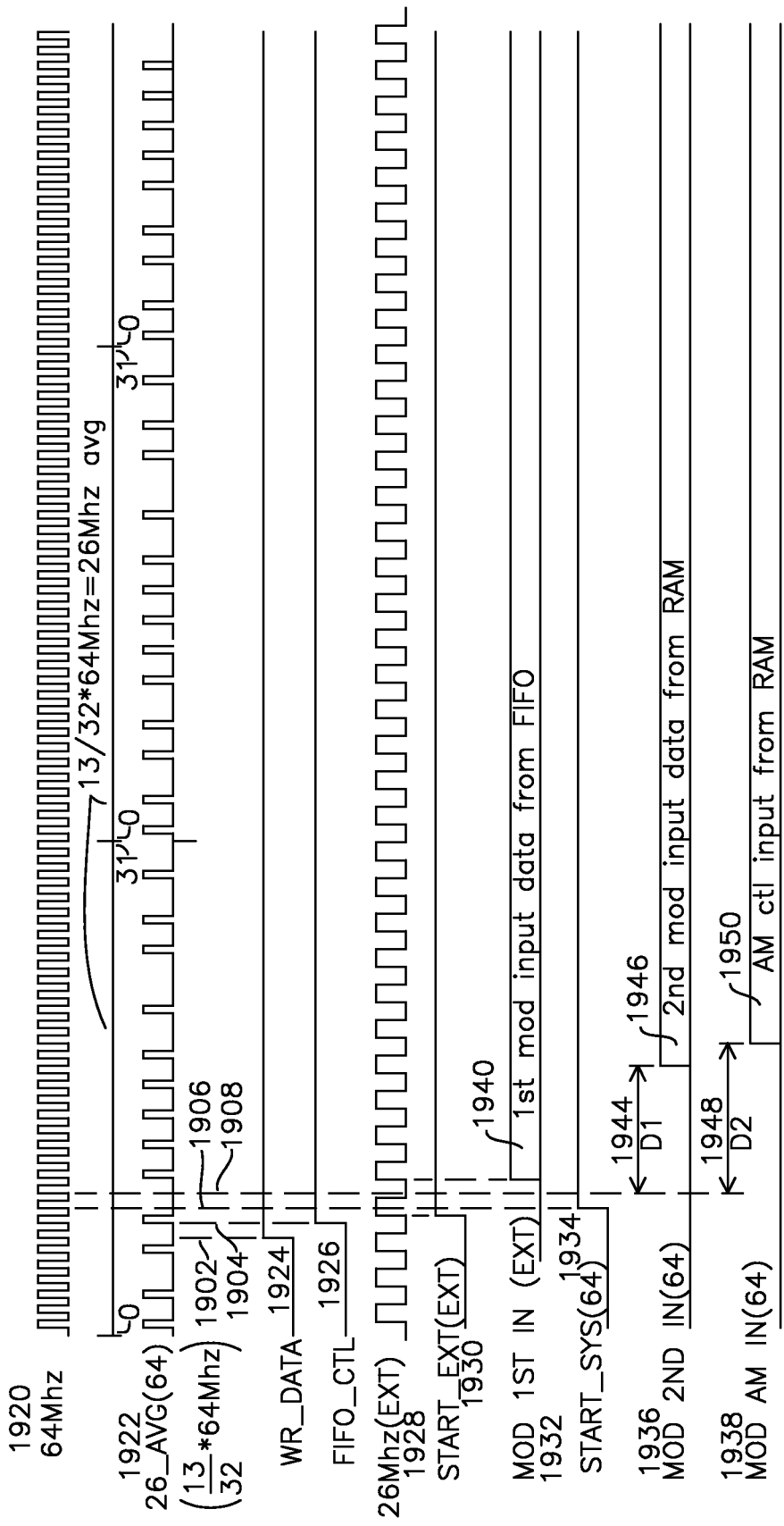
FIG. 19 shows an example timing diagram for the delay compensator.

FIG. 19 shows an example timing diagram associated with the operation of delay equalizer 1800 of FIG. 18. In this example, system clock (sys_clk) 1920 is shown as 64 MHz, which is provided to fractional divider 1802, which in the present example generates number_of_pulses_emitted_in_ interval of 13 with the number_of_clock_cycles_in_interval as 32, which produces 26 MHz average clock frequency, shown as 26_AVG 1922. As can be seen, some inter-edge intervals of avg_clk 26_AVG 1922 are larger than others, which is important for sizing the FIFO 1806 for avoiding FIFO underflow or overflow. The average clock frequency output from the fractional divider 1802 should be approximately equal to the external clock frequency ext_clk 1928.

The start of transmission is signaled by the assertion of WR_DATA 1924, which causes the filtered 1838 and decimated 1839 modulator first data 1832 to be clocked into the FIFO 1806. The WR_DATA 1924 generates FIFO_CTL waveform 1926 from the first synchronizer 1804 using the edge of 26_AVG waveform 1922. The output of first synchronizer, shown as waveform FIFO_CTL 1926 is provided to second synchronizer 1808 which generates START_EXT 1930 from the external clock edge, which begins the clocking out of data from the FIFO 1806, as shown in 1940. The START_EXT 1930 is also provided to the third synchronizer 1810 to generate START_SYS 1934 using the system clock, thereby starting the compensation delay D1 1944, which is followed by the outputting of modulator second input data stored in the memory unit 1816, and the compensation delay D2 1948, which is followed by the outputting of amplitude data stored in the memory unit 1818 to the amplitude control input of the modulator 800.

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions. In addition, embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language (e.g., Java, Smalltalk, C++, etc.) and conventional procedural programming languages (e.g., "C" programming language). The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

While the embodiments are described with reference to various implementations and exploitations, it will be understood that these embodiments are illustrative and that the scope of the inventive subject matter is not limited to them. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A transceiver comprising:
    a signal processing unit operable to generate a low frequency modulator signal, a high frequency modulator signal, and a modulator amplitude control signal; and
    a modulator coupled with the signal processing unit and operable to:
        receive the low frequency modulator signal, the high frequency modulator signal, and the modulator amplitude control signal from the signal processing unit, and
        generate a modulated signal for transmission based on the low frequency modulator signal, the high frequency modulator signal, and the modulator amplitude control signal;
    wherein the signal processing unit comprises a delay compensation unit operable to:
        delay generation of the high frequency modulator signal based, at least in part, on a path delay difference between path delays associated with the low frequency modulator signal and path delays associated with the high frequency modulator signal, and
        delay generation of the modulator amplitude control signal based, at least in part, on a path delay difference between path delays associated with the low frequency modulator signal and path delays associated with the modulator amplitude control signal.

2. The transceiver of claim 1, wherein the delay compensation unit is operable to delay the generation of the high frequency modulator signal based, at least in part, on a path delay difference between signal generation and modulation path delays associated with the low frequency modulator signal and signal generation and modulation path delays associated with the high frequency modulator signal, and operable to delay the generation of the modulator amplitude control signal based, at least in part, on a path delay difference between signal generation and modulation path delays associated with the low frequency modulator signal and signal generation and modulation path delays associated with the modulator amplitude control signal.

3. The transceiver of claim 2, wherein the delay compensation unit is operable to delay the generation of the high frequency modulator signal and the modulator amplitude control signal to substantially time align the low frequency modulator signal, the high frequency modulator signal, and the modulator amplitude control signal at an output of the modulator.

4. The transceiver of claim 1, wherein the signal processing unit comprises signal generation circuitry that is operative on a first clock domain and the modulator comprises modulator circuitry that is operative on a second clock domain, wherein the signal processing unit further comprises an interpolation unit coupled between the signal generation circuitry and the modulation circuitry, wherein the interpolation unit is operable to adapt the low frequency modulator signal from the first clock domain associated with the signal generation circuitry to the second clock domain associated with the modulation circuitry before being provided to the modulator.

5. The transceiver of claim 1, wherein the signal processing unit comprises signal generation circuitry that introduces a first generation path delay into the generation of the low frequency modulator signal, a second generation path delay into the generation of the high frequency modulator signal, and a third generation path delay into the generation of the modulator amplitude control signal, and wherein the modulator comprises modulator circuitry that introduces a first modulator path delay into processing of the low frequency modulator signal, a second modulator path delay into processing of the high frequency modulator signal, and a third modulator path delay into processing of the modulator amplitude control signal.

6. The transceiver of claim 5, wherein the delay compensation unit is operable to:
    determine a total generation and modulator path delay of the low frequency modulator signal based on the first generation path delay and the first modulator path delay;
    determine a total generation and modulator path delay of the high frequency modulator signal based on the second generation path delay and the second modulator path delay;
    determine a total generation and modulator path delay of the modulator amplitude control signal based on the third generation path delay and the third modulator path delay;
    determine a first path delay difference between the total generation and modulator path delay of the low frequency modulator signal and the total generation and modulator path delay of the high frequency modulator signal;
    add a delay to the generation of the high frequency modulator signal based on the first path delay difference;
    determine a second path delay difference between the total generation and modulator path delay of the low frequency modulator signal and the total generation and modulator path delay of the modulator amplitude control signal; and
    add a delay to the generation of the modulator amplitude control signal based on the second path delay difference.

7. The transceiver of claim 1, wherein the delay compensation unit comprises a delay generation unit and a synchronization unit, wherein the delay generation unit is operable to add a first programmable delay to the generation of the high frequency modulator signal and a second programmable delay to the generation of the modulator amplitude control signal, wherein the synchronization unit is operable to control an activation of the delay generation unit based, at least in part, on the generation of the low frequency modulator signal, wherein the synchronization unit is operable to delay the activation of the delay generation unit until the generation of the low frequency modulator signal.

8. The transceiver of claim 1, wherein the delay compensation unit comprises:
    a fractional divider coupled to a first clock, wherein the fractional divider is operable to generate a second clock from the first clock by generating a first number of pulses during an interval having a second number of the first clock cycles; and
    a dual port FIFO coupled to the fractional divider and operable to receive low frequency modulator data at an input port, wherein the low frequency modulator data is clocked into the input port by the second clock when a first control input is asserted, wherein the dual port FIFO is operable to generate the low frequency modulator signal at an output port based on the low frequency modulator data, wherein the output port of the dual port FIFO is clocked by a third clock operative on a different clock domain than the first clock.

9. The transceiver of claim 8, wherein the delay compensation unit further comprises:
    a first synchronizer operable to receive the first control input at an input port, wherein the first synchronizer is clocked by the second clock, wherein the first synchronizer is operable to generate a first synchronizer output based on the first control input and the second clock;
    a second synchronizer coupled to the first synchronizer and operable to receive the first synchronizer output at an input port, wherein the second synchronizer is clocked by the third clock, wherein the second synchronizer is operable to generate a second control signal based on the first synchronizer output and the third clock, wherein the second control signal is provided to the dual port FIFO to enable the output port; and
    a third synchronizer coupled to the second synchronizer and operable to receive the second control signal at an input port, wherein the third synchronizer is clocked by the first clock, wherein the third synchronizer is operable to generate a third control signal based on the second control signal and the first clock.

10. The transceiver of claim 9, wherein the delay compensation unit further comprises a delay generation unit coupled to the third synchronizer and operable to receive the third control signal at an input port, wherein the third control signal enables the delay compensation unit, wherein the delay generation unit is operable to add a first programmable delay to the generation of the high frequency modulator signal and a second programmable delay to the generation of the modulator amplitude control signal.

11. The transceiver of claim 1, wherein the modulator is a polar modulator operable to perform two-point modulation.

12. The transceiver of claim 1, wherein the transceiver is operable to transmit the modulated signal via a wireless or wired communication network.

13. A method for delay compensation in a transceiver, the method comprising:
    generating a low frequency modulator signal, a high frequency modulator signal, and a modulator amplitude control signal;
    delaying generating the high frequency modulator signal based, at least in part, on a path delay difference between signal generation and modulation path delays associated with the low frequency modulator signal and signal generation and modulation path delays associated with the high frequency modulator signal;
    delaying generating the modulator amplitude control signal based, at least in part, on a path delay difference between the signal generation and modulation path delays associated with the low frequency modulator signal and signal generation and modulation path delays associated with the modulator amplitude control signal; and generating a modulated signal for transmission based on the low frequency modulator signal, the high frequency modulator signal, and the modulator amplitude control signal.

14. The method of claim 13, wherein said delaying generating the high frequency modulator signal and the modulator amplitude control signal comprises delaying generating the high frequency modulator signal and the modulator amplitude control signal such that the low frequency modulator signal, the high frequency modulator signal, and the modulator amplitude control signal are substantially time aligned at an output of a modulator circuit of the transceiver.

15. An integrated circuit comprising:
a signal processing unit operable to generate a low frequency modulator signal, a high frequency modulator signal, and a modulator amplitude control signal; and
a modulator coupled with the signal processing unit and operable to:
receive the low frequency modulator signal, the high frequency modulator signal, and the modulator amplitude control signal from the signal processing unit, and
generate a modulated signal based on the low frequency modulator signal, the high frequency modulator signal, and the modulator amplitude control signal;
wherein the signal processing unit comprises a delay compensation unit operable to:
delay generation of the high frequency modulator signal based, at least in part, on a path delay difference between path delays associated with the low frequency modulator signal and path delays associated with the high frequency modulator signal, and
delay generation of the modulator amplitude control signal based, at least in part, on a path delay difference between path delays associated with the low frequency modulator signal and path delays associated with the modulator amplitude control signal.

16. The integrated circuit of claim 15, wherein the delay compensation unit is operable to delay the generation of the high frequency modulator signal based, at least in part, on a path delay difference between signal generation and modulation path delays associated with the low frequency modulator signal and signal generation and modulation path delays associated with the high frequency modulator signal, and operable to delay the generation of the modulator amplitude control signal based, at least in part, on a path delay difference between signal generation and modulation path delays associated with the low frequency modulator signal and signal generation and modulation path delays associated with the modulator amplitude control signal.

17. The integrated circuit of claim 16, wherein the delay compensation unit is operable to delay the generation of the high frequency modulator signal and the modulator amplitude control signal to substantially time align the low frequency modulator signal, the high frequency modulator signal, and the modulator amplitude control signal at an output of the modulator.

18. The integrated circuit of claim 15, wherein the signal processing unit comprises signal generation circuitry that is operative on a first clock domain and the modulator comprises modulator circuitry that is operative on a second clock domain, wherein the signal processing unit further comprises an interpolation unit coupled between the signal generation circuitry and the modulation circuitry, wherein the interpolation unit is operable to adapt the low frequency modulator signal from the first clock domain associated with the signal generation circuitry to the second clock domain associated with the modulation circuitry before being provided to the modulator.

19. The integrated circuit of claim 15, wherein the delay compensation unit comprises a delay generation unit and a synchronization unit, wherein the delay generation unit is operable to add a first programmable delay to the generation of the high frequency modulator signal and a second programmable delay to the generation of the modulator amplitude control signal, wherein the synchronization unit is operable to control an activation of the delay generation unit based, at least in part, on the generation of the low frequency modulator signal, wherein the synchronization unit is operable to delay the activation of the delay generation unit until the generation of the low frequency modulator signal.

20. The integrated circuit of claim 15, wherein the modulator is a polar modulator operable to perform two-point modulation.

* * * * *